(12) United States Patent
Funakoshi et al.

(10) Patent No.: US 8,093,723 B2
(45) Date of Patent: Jan. 10, 2012

(54) METHOD OF MANUFACTURING A SEMICONDUCTOR INTEGRATED CIRCUIT DEVICE

(75) Inventors: Takako Funakoshi, Tokyo (JP); Eiichi Murakami, Saitama (JP); Kazumasa Yanagisawa, Tokyo (JP); Kan Takeuchi, Tokyo (JP); Hideo Aoki, Tokyo (JP); Hizuru Yamaguchi, Tokyo (JP); Takayuki Oshima, Tokyo (JP); Kazuyuki Tsunokuni, Iharaki (JP); Kousuke Okuyama, Saitama (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/098,648

(22) Filed: May 2, 2011

(65) Prior Publication Data

US 2011/0204486 A1 Aug. 25, 2011

Related U.S. Application Data

(60) Continuation of application No. 12/764,411, filed on Apr. 21, 2010, which is a continuation of application No. 12/188,591, filed on Aug. 8, 2008, now Pat. No. 7,786,585, which is a continuation of application No. 11/239,371, filed on Sep. 30, 2005, now Pat. No. 7,411,301, which is a division of application No. 10/465,541, filed on Jun. 20, 2003, now Pat. No. 7,023,091.

(30) Foreign Application Priority Data

Jun. 21, 2002 (JP) ................................. 2002-181974

(51) Int. Cl.
*H01L 23/48* (2006.01)
*H01L 23/52* (2006.01)
*H01L 29/40* (2006.01)

(52) U.S. Cl. ............................... 257/758; 257/E23.145
(58) Field of Classification Search .................. 257/758, 257/774, E23.145
See application file for complete search history.

(56) References Cited

U.S. PATENT DOCUMENTS

| 4,536,951 A | 8/1985 | Rhodes et al. |
| 5,019,877 A | 5/1991 | Hosogi |
| 5,675,187 A | 10/1997 | Numata et al. |

(Continued)

FOREIGN PATENT DOCUMENTS

JP 64-090544 4/1989

(Continued)

OTHER PUBLICATIONS

E. T. Ogawa et al, "Stress-Induced Voiding Under Vias Connected to Wide Cu Metal Leads," Texas Instruments Inc., IEEE 02CH37320, 40th Annual International Reliability Physics Symposium, Dallas, 2002. pp. 312-321.

*Primary Examiner* — Jenny L Wagner
(74) *Attorney, Agent, or Firm* — Antonelli, Terry, Stout & Kraus, LLP.

(57) ABSTRACT

In a semiconductor integrated circuit device having plural layers of buried wirings, it is intended to prevent the occurrence of a discontinuity caused by stress migration at an interface between a plug connected at a bottom thereof to a buried wiring and the buried wiring. For example, in the case where the width of a first Cu wiring is not smaller than about 0.9 μm and is smaller than about 1.44 μm, and the width of a second Cu wiring and the diameter of a plug are about 0.18 μm, there are arranged two or more plugs which connect the first wirings and the second Cu wirings electrically with each other.

8 Claims, 30 Drawing Sheets

U.S. PATENT DOCUMENTS

| | | |
|---|---|---|
| 6,373,136 B2 | 4/2002 | Otsuka et al. |
| 6,727,026 B2 | 4/2004 | Kuji et al. |
| 7,023,091 B2 | 4/2006 | Funakoshi et al. |
| 7,411,301 B2 | 8/2008 | Funakoshi et al. |
| 2002/0100984 A1 | 8/2002 | Oshima et al. |
| 2003/0189224 A1 | 10/2003 | Ohsaki et al. |
| 2003/0218259 A1 | 11/2003 | Chesire et al. |
| 2004/0173906 A1 | 9/2004 | Saito et al. |

FOREIGN PATENT DOCUMENTS

| | | |
|---|---|---|
| JP | 03-145743 | 6/1991 |
| JP | 08-316330 A | 11/1996 |
| JP | 11-074355 | 3/1999 |
| JP | 2001-118922 | 4/2001 |
| JP | 2002-124565 | 4/2001 |
| JP | 2001-298084 | 10/2001 |
| JP | 2001-337440 A | 12/2001 |

3W: Cu WIRING (FIRST BURIED WIRING)
43: Cu WIRING (SECOND BURIED WIRING)
43P: PLUG (FIRST PLUG, SECOND PLUG)

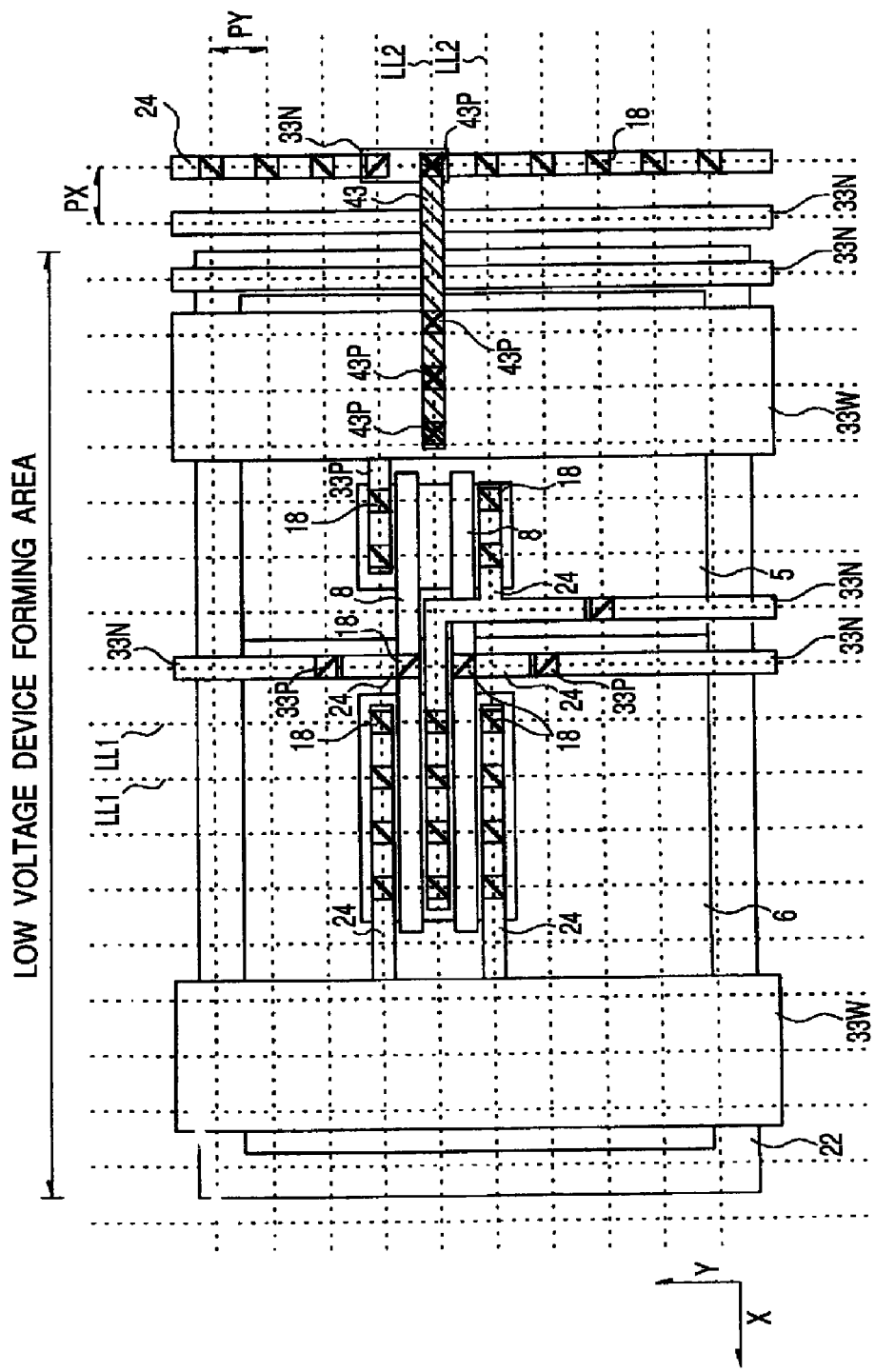

METHOD OF MANUFACTURING A SEMICONDUCTOR INTEGRATED CIRCUIT DEVICE

This application is a continuation of U.S. application Ser. No. 12/764,411, filed Apr. 21, 2010, which, in turn, is a continuation of U.S. application Ser. No. 12/188,591, filed Aug. 8, 2008, now U.S. Pat. No. 7,786,585, which, in turn, is a continuation of U.S. application Ser. No. 11/239,371, filed Sep. 30, 2005, now U.S. Pat. No. 7,411,301, and which, in turn, is a divisional of U.S. application Ser. No. 10/465,541, filed Jun. 20, 2003, now U.S. Pat. No. 7,023,091, and the entire disclosures of which are hereby incorporated by reference.

BACKGROUND OF THE INVENTION

The present invention relates to a semiconductor integrated circuit device and to a technique for manufacturing the same. More particularly, the invention is concerned with a technique that is applicable to the fabrication of a semiconductor integrated circuit device having wiring which is formed by burying a conductive film in a wiring-forming groove formed in an insulator.

With improvement in the integration level of elements in a semiconductor integrated circuit device and reduction in size of a semiconductor chip, the wiring which constitutes the semiconductor integrated circuit device is becoming more and more fine and multi-layered. Particularly, in a semiconductor integrated circuit device of a logic type having a multi-layer wiring structure, a wiring delay is one dominant factor of the signal delay in the whole of the semiconductor integrated circuit device. The speed of a signal traveling through the wiring is proportional to both the wiring resistance and the wiring capacitance, and so, for correcting the wiring delay, it is important that both the wiring resistance and the wiring capacitance be decreased.

For decreasing the wiring resistance, the application of a damascene method using a copper material (copper (Cu) or a copper alloy) as a wiring material is being promoted. According to this method, a wiring groove or a connection hole is formed in an insulating film, then a wiring-forming or plug-forming conductive film is deposited on a main surface of a semiconductor substrate, and the conductive film present in other areas than the wiring groove or connection hole is removed by a chemical mechanical polishing (CMP) method, thereby to form buried wiring in the wiring groove or to form a plug in the connection hole. This method is suitable particularly for forming buried wiring using a copper-based conductive material for which microetching is difficult.

As a practical application of the damascene method, there is a dual-damascene method. According to this method, a connection hole for effecting connection between a wiring-forming groove (hereinafter referred simply to as a "wiring groove") and underlying wiring is formed in an insulating film, then a wiring-forming conductive film is deposited on a main surface of a semiconductor substrate, further, the conductive film is removed by CMP in other areas than the groove so as to form buried wiring in the wiring groove, and a plug is formed within the connection hole. According to this method, especially in the manufacture of a semiconductor integrated circuit having a multi-layer interconnection structure, it is possible to reduce the number of manufacturing steps and reduce the wiring cost.

A wiring-forming technique using such a damascene method is disclosed, for example, in Japanese Unexamined Patent Publication No. Hei 10 (1998)-135153.

In Japanese Unexamined Patent Publication No. 2001-118922, in connection with a semiconductor device having buried wiring and a connection hole, the buried wiring comprising a conductive barrier film formed of a refractory metal or a refractory metal nitride and a main conductive layer formed of Cu, Cu alloy, Ag (silver), or Ag alloy, the connection hole being formed in an insulating film which is deposited on the buried wiring and which reaches an upper surface of the buried wiring, there is disclosed a technique wherein the connection hole has a bottom of a size almost equal to the size which covers the width of the buried wiring, and a multi-layer film of the same layer structure as that of the buried wiring is buried in the connection hole to form a plug, whereby the expansion of a void formed by an electromigration phenomenon at the plug-buried wiring boundary superior in adhesion is prevented.

SUMMARY OF THE INVENTION

Having studied the technique for forming buried wiring in a wiring-forming groove, the present inventors have discovered the following new problems.

In case of forming plural layers of wiring lines with the use of a copper material, first buried wiring lines of a lower layer ("first buried wiring line(s)" hereinafter) are formed, then polishing residues of the copper material present on surfaces of the first-buried wiring lines are removed for preventing the deterioration of a time dependent dielectric breakdown (TDDB) characteristic between adjacent first buried wiring lines, and, thereafter, the surfaces are modified, for example, by removing gas, moisture and organic matter that has adhered to the surfaces with use of ammonia plasma, to form highly reliable buried wiring lines. Subsequently, for preventing diffusion of the copper material, which forms the first buried wiring lines, to an insulating film in which buried wiring lines of an upper layer ("second buried wiring line(s)" hereinafter) are formed and for preventing the exertion of a bad influence of the diffused copper material on the device characteristic, there is formed, for example, as a copper material diffusion preventing film, a cap insulating film, such as a silicon nitride film, on the first buried wiring lines. Next, an insulating film, such as a silicon oxide film, is deposited on the silicon nitride film, and then, this insulating film and the cap insulating film are etched to form wiring grooves for formation of the second buried wiring lines and also to form connection holes reaching the first buried wiring lines. Thereafter, a copper material is buried into the wiring grooves and the connection holes to form plugs which connect to the second and first buried wiring lines. In the film of the first buried wiring lines, there are many dotted vacant holes (atom-free holes). Such vacant holes are present in an extremely large number particularly in the case of a plating film. In the presence of such dotted vacant holes, if a semiconductor wafer formed with first and second buried wiring lines is subjected to a high-temperature shelf test (stress migration test), the vacant holes migrate to the region where the cap insulating film is not present, i.e., to the plug-first buried wiring interface, so as to relax the thermal stress (this phenomenon will hereinafter be referred to as "stress migration"). When the vacant holes gather into a large void at the plug-first buried wiring interface, a discontinuity occurs between the associated plug and first buried wiring line.

By improving the buried wiring-forming process, the present inventors were able to attain to some extent a decrease of stress in the interior of the copper material which forms the buried wiring lines and a decrease in the occurrence of many vacant holes in the buried wiring lines, but it was newly discovered that, in a case where the width of an associated first buried wiring line connected to one plug is large, a discontinuity could occur due to stress migration. This discontinuity defect is apt to occur as the diameter of each connection hole with a plug formed therein becomes smaller with microfabrication. The migration of vacant holes formed in the film of a buried wiring line occurs concentrically in all directions centered on the bottom of a plug connected to the buried wiring line, so that the present inventors presume that the larger the number of vacant holes present in concentric circles, the more rapid will be the growth of many vacant holes in the film which forms the plug and the buried wiring line and the shorter will be the time until a discontinuity is produced (stress migration life). That is, the present inventors suspect that the larger the width of a first buried wiring line connected to one plug, the easier will be the occurrence of a discontinuity caused by stress migration.

In connection with a semiconductor integrated circuit having plural layers of buried wiring lines, it is an object of the present invention to provide means for preventing the occurrence of a discontinuity caused by stress migration at an interface between a plug connected at a bottom thereof to a buried wiring line and the buried wiring line.

The above and other objects and novel features of the present invention will become more apparent from the following description and the accompanying drawings.

Typical modes of the present invention as disclosed herein will be outlined below.

In one aspect of the present invention, there is provided a semiconductor integrated circuit device comprising a first buried wiring formed in the interior of a first wiring groove formed in a first insulating film, a second insulating film formed in a layer overlying the first insulating film, a second buried wiring formed in the interior of a second wiring groove formed in a second insulating film, and a first plug formed in the interior of a first hole formed in the second insulating film to connect the first buried wiring and the second buried wiring electrically with each other, wherein a first position at which the first plug and the first buried wiring are connected with each other is established so that the distances from the first position up to both ends in the width direction of the first buried wiring are different from each other.

In another aspect of the present invention there is provided a semiconductor integrated circuit device comprising a first buried wiring formed in the interior of a first wiring groove formed in a first insulating film, a second insulating film formed in a layer overlying the first insulating film, a second buried wiring and a third buried wiring formed, respectively, in the interiors of a second wiring groove and a third wiring groove both formed in the second insulating film, and a first plug and a second plug formed, respectively, in the interiors of a first hole and a second hole both formed in the second insulating film, the first plug connecting the first buried wiring and the second buried wiring with each other electrically, and the second plug connecting the first buried wiring and the third buried wiring with each other electrically, wherein the diameter of the first plug is larger than that of the second plug.

In a further aspect of the present invention, there is provided a semiconductor integrated circuit device comprising a first buried wiring formed in the interior of a first wiring groove formed in a first insulating film, a second insulating film formed in a layer overlying the first insulating film, a second buried wiring formed in the interior of a second wiring groove formed in the second insulating film, and a plurality of first plugs formed in the interiors of a plurality of first holes formed in the second insulating film, the first plugs connecting the first buried wiring and the second buried wiring with each other electrically.

In a still further aspect of the present invention, there is provided a method of manufacturing a semiconductor integrated circuit device, comprising the steps of forming a first insulating film on a semiconductor substrate, forming a first wiring groove in the first insulating film, burying a first conductive film into the first wiring groove to form a first buried wiring, forming a second insulating film and a third insulating film successively on the first insulating film and the first buried wiring, etching the third insulating film and the second insulating film to form a second wiring groove and a first hole, the first hole being open in a bottom of the second wiring groove and reaching the first buried wiring, and burying a third conductive film into the first hole and the second wiring groove to integrally form a first plug connected to the first buried wiring at a first position and a second buried wiring connected to the first plug, wherein the first position is established so that the distances from the first position up to both ends in the width direction of the first buried wiring are different from each other.

In a still further aspect of the present invention, there is provided a method of manufacturing a semiconductor integrated circuit device, comprising the steps of forming a first insulating film on a semiconductor substrate, forming a first wiring groove in the first insulating film, burying a first conductive film into the first wiring groove to form a first buried wiring, forming a second insulating film and a third insulating film successively on the first insulating film and the first buried wiring, etching the third insulating film and the second insulating film to form a second wiring groove, a third wiring groove, a first hole, and a second hole, the first hole being open in a bottom of the second wiring groove and reaching the first buried wiring, the second hole being open in a bottom of the third wiring groove and reaching the first buried wiring, and burying a third conductive film into the first and second holes and the second and third wiring grooves to integrally form a first plug connected to the first buried wiring, a second plug connected to the first buried wiring, a second buried wiring connected to the first plug, and a third buried wiring connected to the second plug, wherein the diameter of the first plug is larger than that of the second plug.

In a still further aspect of the present invention, there is provided a method of manufacturing a semiconductor integrated circuit device, comprising the steps of:
(a) forming a first insulating film on the semiconductor substrate;
(b) forming a first wiring groove in the first insulator;
(c) burying a first conductive film into the first wiring groove to form a first buried wiring;
(d) forming a second insulating film and a third insulating film successively on the first insulating film and the first buried wiring;
(e) etching the third insulating film and the second insulating film to form a second wiring groove and a plurality of first holes, the first holes being open in a bottom of the second wiring groove and reaching the first buried wiring; and
(f) burying a third conductive film into the plural first holes and the second wiring groove to integrally form a plurality of first plugs and a second buried wiring, the plural first plugs being connected to the first buried wiring at a first position, the second buried wiring being connected to the plural first plugs.

In a still further aspect of the present invention, there is provided a method of manufacturing a semiconductor integrated circuit device, comprising the steps of:

(a) forming a first insulating film on a semiconductor substrate;
(b) forming a first wiring groove in the first insulating film;
(c) burying a first conductive film into the first wiring groove to form a first buried wiring;
(d) forming a second insulating film on the first insulating film and the first buried wiring;
(e) forming a first hole in the second insulating film, the first hole reaching the first buried wiring;
(f) burying a second conductive film into the first hole to form a first plug which is connected to the first buried wiring at a first position;
(g) forming a third insulating film on the second insulating film and the first plug;
(h) forming a second wiring groove in the third insulating film, the second wiring groove reaching the first plug; and
(i) burying a third conductive film into the second wiring groove to form a second buried wiring connected to the first plug,
wherein the first position is established so that the distances from the first position up to both ends in the width direction of the first buried wiring are different from each other.

In a still further aspect of the present invention, there is provided a method of manufacturing a semiconductor integrated circuit device, comprising the steps of:
(a) forming a first insulating film on a semiconductor substrate;
(b) forming a first wiring groove in the first insulating film;
(c) burying a first conductive film into the first wiring groove to form a first buried wiring;
(d) forming a second insulating film and a third insulating film successively on the first insulating film and the first buried wiring;
(e) etching the third insulating film and the second insulating film to form a second wiring groove and a first hole, the first hole being open in a bottom of the second wiring groove and reaching the first buried wiring; and
(f) burying a third conductive film into the first hole and the second wiring groove to integrally form a first plug connected to the first buried wiring at a first position and a second buried wiring connected to the first plug, wherein the first position is established so that the distances from the first position up to both ends in the width direction of the first buried wiring are different from each other.

In a still further aspect of the present invention there is provided a method of manufacturing a semiconductor integrated circuit device, comprising the steps of:
(a) forming a first insulating film on a semiconductor substrate;
(b) forming a first wiring groove and a third wiring groove in the first insulating film;
(c) burying a first conductive film into the first wiring groove and the third wiring groove to respectively form a first buried wiring and a third buried wiring smaller in width than the first buried wiring;
(d) forming a second insulating film on the first insulating film, the first buried wiring and the third buried wiring;
(e) forming in the second insulating film a first hole reaching the first buried wiring and a second hole reaching the third buried wiring;
(f) burying a second conductive film into the first and second holes to form a first plug connected to the first buried wiring and a second plug connected to the third buried wiring;
(g) forming a third insulating film on the second insulating film and the first and second plugs;
(h) forming a second wiring groove in the third insulating film, the second wiring groove reaching the first and second plugs; and
(i) burying a third conductive film into the second wiring groove to form a second buried wiring connected to the first and second plugs, wherein the diameter of the first plug is larger than that of the second plug.

In a still further aspect of the present invention, there is provided a method of manufacturing a semiconductor integrated circuit device, comprising the steps of:
(a) forming a first insulating film on a semiconductor substrate;
(b) forming a first wiring groove and a third wiring groove in the first insulating film;
(c) burying a first conductive film into the first wiring groove and the third wiring groove to respectively form a first buried wiring and a third buried wiring smaller in width than the first buried wiring;
(d) forming a second insulating film and a third insulating film successively on the first insulating film, the first buried wiring and the third buried wiring;
(e) etching the third and second insulating films to form a second wiring groove, a first hole, and a second hole, the first hole being open in a bottom of the second wiring groove and reaching the first buried wiring, the second hole reaching the third buried wiring; and
(f) burying a third conductive film into the first and second holes and the second wiring groove to integrally form a first plug connected to the first buried wiring, a second plug connected to the third buried wiring, and a second buried wiring connected to the first and second plugs, wherein the diameter of the first plug is larger than that of the second plug.

In a still further aspect of the present invention, there is provided a method of manufacturing a semiconductor integrated circuit device, comprising the steps of:
(a) forming a first insulating film on a semiconductor substrate;
(b) forming a first wiring groove in the first insulating film;
(c) burying a first conductive film into the first wiring groove to form a first buried wiring;
(d) forming a second insulating film on the first insulating film and the first buried wiring;
(e) forming in the second insulating film a plurality of first holes reaching the first buried wiring;
(f) burying a second conductive film into the plural first holes to form a plurality of first plugs connected to the first buried wiring;
(g) forming a third insulating film on the second insulating film and the plural first plugs;
(h) forming in the third insulating film a second wiring groove reaching the plural first plugs; and
(i) burying a third conductive film into the second wiring groove to form a second buried wiring connected to the plural first plugs.

In a still further aspect of the present invention, there is provided a method of manufacturing a semiconductor integrated circuit device, comprising the steps of:
(a) forming a first insulating film on a semiconductor substrate;
(b) forming a first wiring groove in the first insulating film;
(c) burying a first conductive film into the first wiring groove to form a first buried wiring;
(d) forming a second insulating film and a third insulating film successively on the first insulating film and the first buried wiring;
(e) etching the third and second insulating films to form a second wiring groove and a plurality of first holes, the plural first holes being open in a bottom of the second wiring groove and reaching the first buried wiring; and (f) burying a third conductive film into the plural first holes and the second wiring groove to integrally form a plurality of first plugs connected to the first buried wiring at a first position and a second buried wiring connected to the plural first plugs.

In a still further aspect of the present invention, an end of the first plug is located at the same position as an end in the width direction of the first buried wiring in plan.

In a still further aspect of the present invention, the diameter of the first plug is equal to the width of the second buried wiring.

In a still further aspect of the present invention, an end of at least one of the plural first plugs is located at the same position as an end in the width direction of the first buried wiring.

In a still further aspect of the present invention, the plural first plugs are arranged at an equal interval.

In a still further aspect of the present invention, the plural first plugs are arranged at an interval equal to the diameter of each of the first plugs.

In a still further aspect of the present invention, the diameter of the first plug in an extending direction of the second buried wiring is set to be twice or more as large as the diameter of the first plug in an extending direction of the first buried wiring.

In a still further aspect of the present invention, the step (b) includes a step (b1) of forming a third wiring groove in the first insulating film, the step (c) includes a step (c1) of burying the first conductive film into the third wiring groove to form a third buried wiring smaller in width than the first buried wiring, the step (e) includes a step (e1) of forming in the second insulating film a second hole reaching the third buried wiring, the step (f) includes a step (f1) of burying a second conductive film into the second hole to form a second plug connected to the third buried wiring, the second wiring groove reaches the second plug, and the diameter of the first plug is set to be larger than the diameter of the second plug.

In a still further aspect of the present invention, the step (b) includes a step (b1) of forming a third wiring groove in the first insulating film, the step (c) includes a step (c1) of burying the first conductive film into the third wiring groove to form a third buried wiring smaller in width than the first buried wiring, the step (e) includes a step (e1) of etching the third and second insulating films to form a second hole, the second hole being open in a bottom of the second wiring groove and reaching the third buried wiring, the step (f) includes a step (f1) of burying the third conductive film into the second hole and the second wiring groove to integrally form a second plug connected to the third buried wiring and a second buried wiring connected to the second plug, and the diameter of the first plug is set to be larger than the diameter of the second plug.

In a still further aspect of the present invention, as seen in plan view, the center in the width direction of the first buried wiring lies on a first wiring lattice line, the center in the width direction of the second buried wiring lies on a second wiring lattice line, and the center of the first plug is spaced from the first wiring lattice line by at least a minimum distance, which is set for alignment margin in forming the first plug.

In a still further aspect of the present invention, the first conductive film contains copper as a main component.

BRIEF DESCRIPTION OF THE DRAWINGS

FIG. 40 is a plan view of a principal portion of a semiconductor integrated circuit device according to a fifth embodiment of the present invention as seen during the manufacture thereof.

DETAILED DESCRIPTION OF PREFERRED EMBODIMENTS

Figure 1:
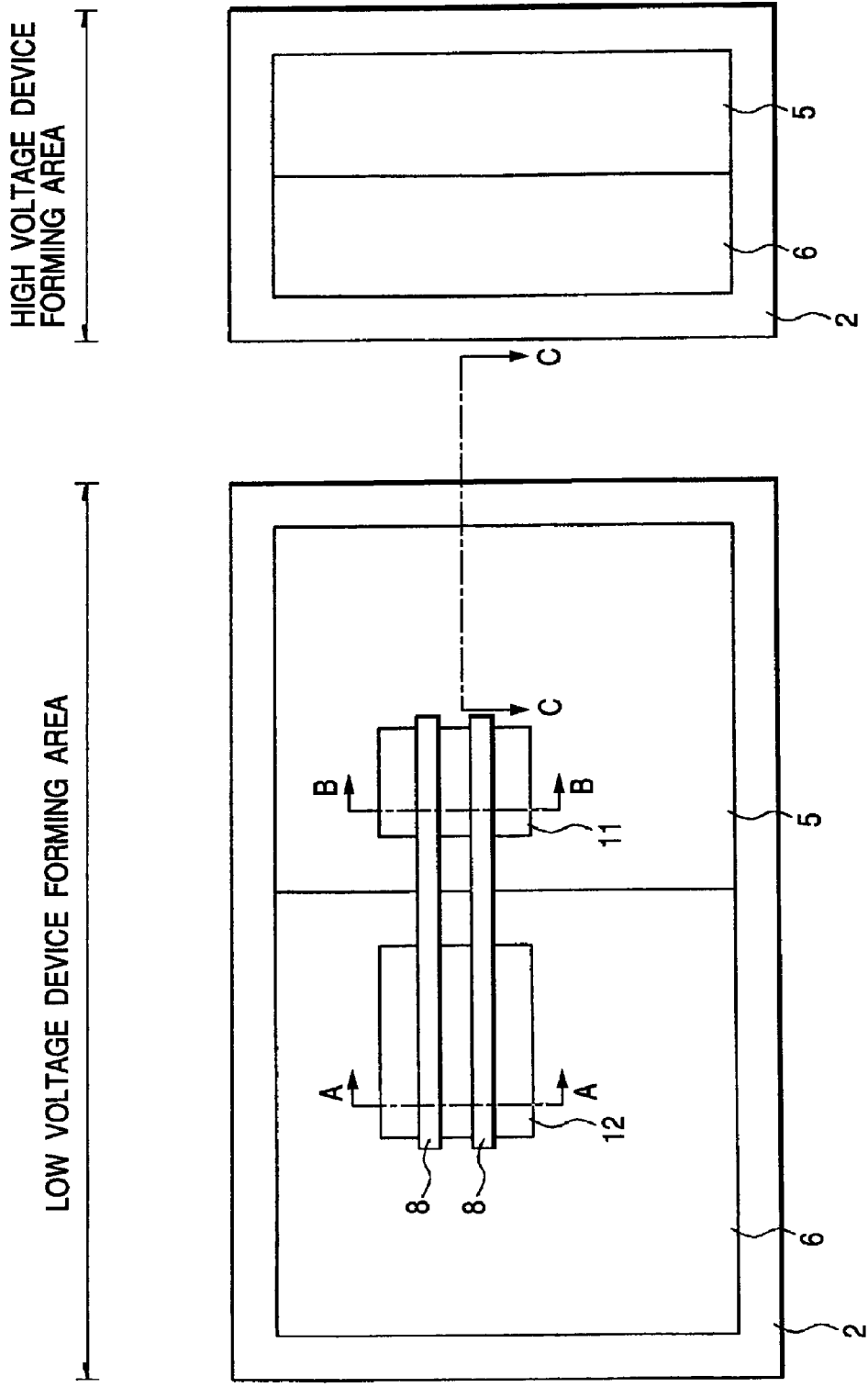
FIG. 1 is a plan view of a principal portion of a semiconductor integrated circuit device according to a first embodiment of the present invention, as seen during the manufacture thereof.

Embodiments of the present invention will be described in detail hereinunder with reference to the accompanying drawings. In all of the drawings, components having the same functions are identified by like reference numerals, and repeated explanations thereof will be omitted. In the drawings used for explaining the following embodiments, even a plan view may be hatched to facilitate understanding of component constructions.

First Embodiment

The semiconductor integrated circuit device according to a first embodiment of the present invention is, for example, a CMOS (Complementary-Metal-Oxide-Semiconductor)-LSI. A method of manufacturing the semiconductor integrated circuit device will be described below in the order of the manufacturing steps thereof.

Figure 2:
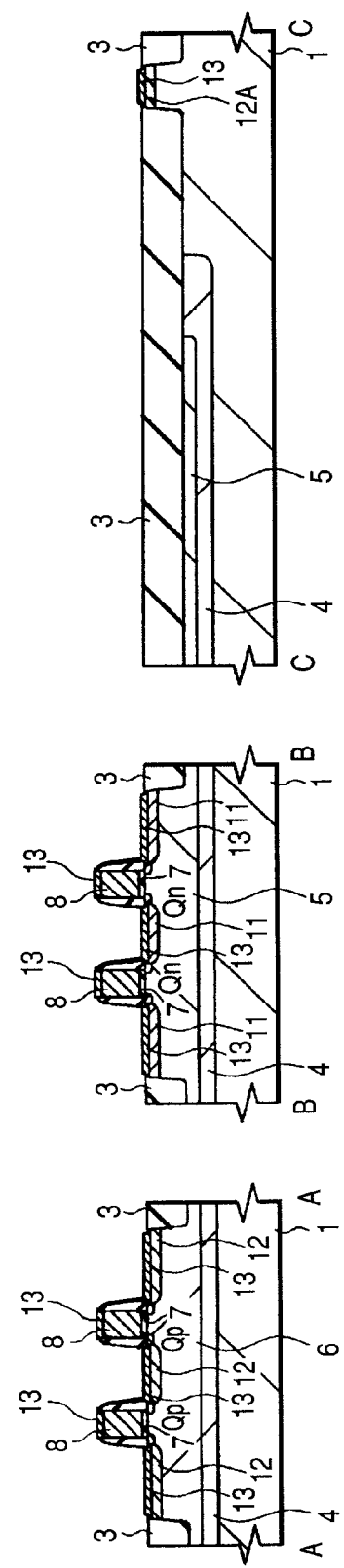
FIG. 2 shows sectional views taken along lines A-A, B-B and C-C in FIG. 1.

FIG. 1 is a plan view of a principal portion of the semiconductor integrated circuit device of the first embodiment, and FIG. 2 comprises sectional views taken along lines A-A, B-B and C-C in FIG. 1. In FIG. 1, a low voltage device forming area is an area in which a circuit is formed with a relatively high voltage applied thereto, while a high voltage device forming area is an area in which a circuit is formed with a relatively low voltage applied thereto.

First, as shown in FIGS. 1 and 2, an element isolation region 3 is formed on a semiconductor substrate 1 of a p-type single crystal silicon having a specific resistance of, for example, 1 to 10 Ωcm. For example, the element isolation region 3 is formed by etching the semiconductor substrate 1 in the element isolation region to form an element isolation trench, then depositing a silicon oxide film as an insulating film on the semiconductor substrate 1 including the interior of the element isolation trench by a CVD (Chemical Vapor Deposition) method, and thereafter removing the silicon oxide film present outside the element isolation trench by chemical mechanical polishing.

Subsequently, for example, an impurity (e.g., P (phosphorus)) having a conductive type of n is introduced into the semiconductor substrate 1 by an ion implantation method, and thereafter the semiconductor substrate 1 is subjected to heat treatment, allowing the n-type impurity to be diffused to form an n-type isolation region 4.

Next, for example, B (boron) is ion-implanted to part of the semiconductor substrate 1, while P is ion-implanted to another part of the semiconductor substrate, to form a p-type well 5 and an n-type well 6, followed by steam oxidation of the substrate 1 to form a gate oxide film 7 to serve as a gate insulating film of MISFET (Metal-Insulator-Semiconductor-Field-Effect-Transistor) on a surface of each of the p- and n-type wells 5, 6.

Subsequently, gate electrodes 8 are formed on the p- and n-type wells 5, 6, respectively. The gate electrodes 8 are each formed, for example, by depositing a polycrystalline silicon film on the gate oxide film 7 by CVD, then ion-implanting P into the polycrystalline silicon film on the p-type well 5, ion-implanting B into the polycrystalline silicon film on the n-type well 6, and thereafter patterning the polycrystalline silicon film by dry etching using a photoresist film as a mask.

Then, an n⁻-type semiconductor region of a low impurity concentration is formed by ion-implanting P or As (arsenicum) into the p-type well 5, and a p⁻-type semiconductor region of a low impurity concentration is formed by ion-implanting B into the n-type well 6. Next, a silicon nitride film is deposited as an insulating film on the semiconductor substrate 1 by CVD, and it is then etched anisotropically to form side wall spacers on side walls of each gate electrode 8. This is followed by ion-implantation of P or As into the p-type well 5 to form n⁺-type semiconductor regions 11 (source, drain) of a high impurity concentration, and subsequent ion-implantation of boron into the n-type well 6 is performed to form p⁺-type semiconductor regions 12 (source, drain) of a high impurity concentration and a p-type extraction layer 12A.

After subsequent washing of a surface of the semiconductor substrate 1, a silicide layer 13 is formed on surfaces of all of the gate electrodes 8, the n⁺-type semiconductor regions 11 (source, drain), the p⁺-type semiconductor regions 12 (source, drain) and the p-type extraction layer 12A. For example, the silicide layer 13 is formed by depositing a Co (cobalt) film on the semiconductor substrate 1 by a sputtering method, then performing a heat treatment in a nitrogen gas atmosphere, allowing the semiconductor substrate 1 and the gate electrode 8 to react with the Co film, and thereafter removing unreacted Co film by wet etching. By the steps described above, an n-channel MISFETQn and a p-channel MISFETQp are formed. According to this first embodiment, a semiconductor element and wiring lines are formed in the high voltage device forming area as in the low voltage device forming area. But in plan view, including FIG. 1, components other than the n-type isolation region 4 and the p- and n-type wells 5, 6 are not shown in the high voltage device forming area in order to facilitate understanding of the planar construction of a principal portion of the semiconductor integrated circuit device according to this first embodiment.

Figure 3:
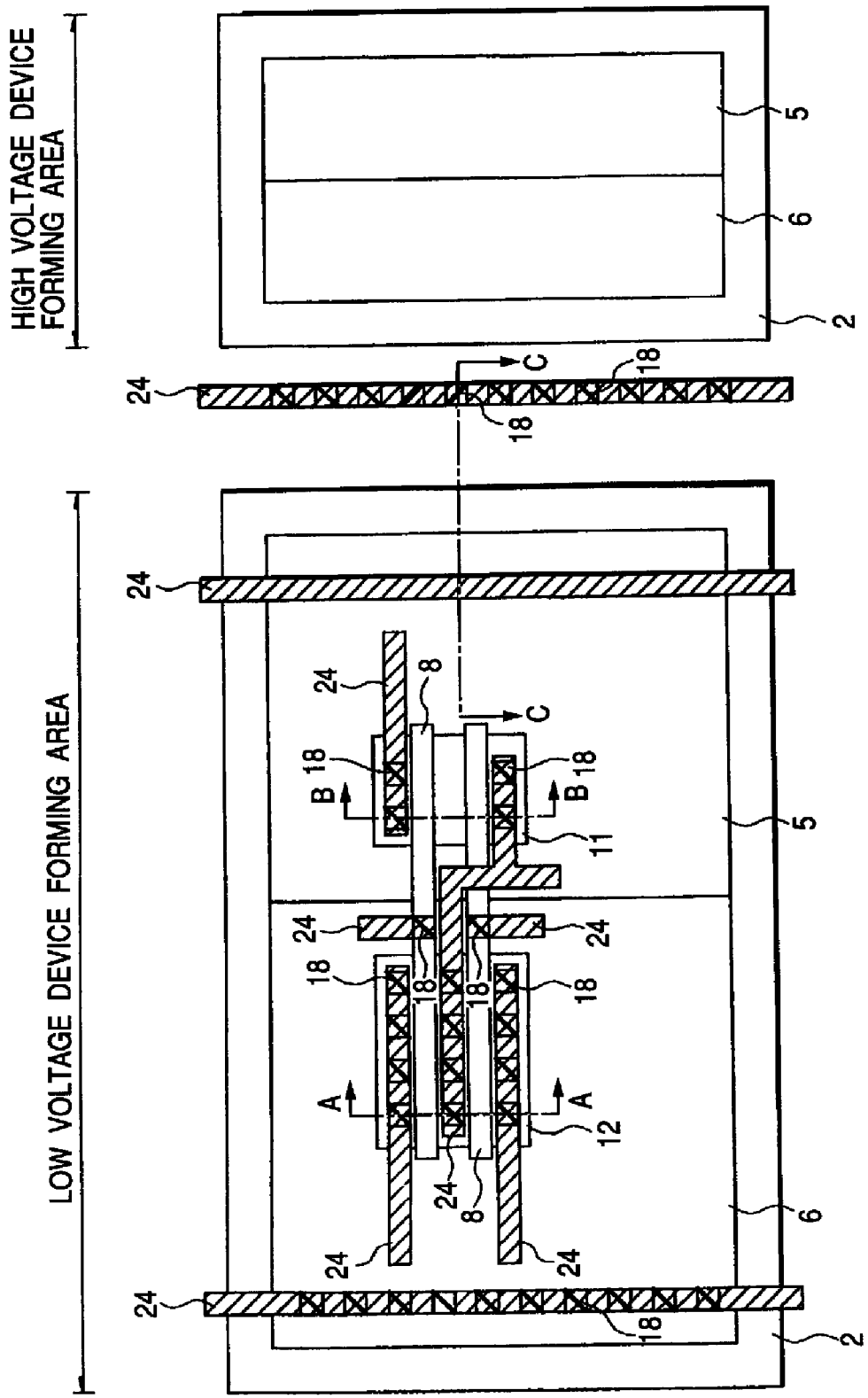
FIG. 3 is a plan view of a principal portion of the semiconductor integrated circuit device, following the processing shown in FIG. 1.
Figure 4:
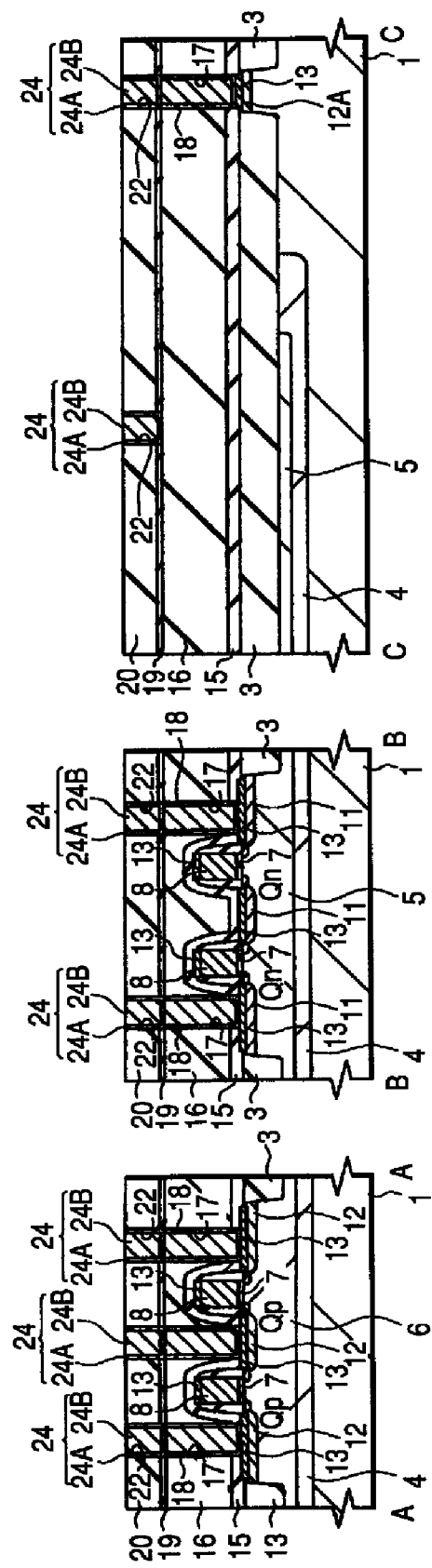
FIG. 4 is a sectional view of a principal portion of the semiconductor integrated circuit device, following the processing shown in FIG. 2.

Next, as shown in FIGS. 3 and 4, a silicon nitride film 15, which serves as an insulating film for self-align contact, is deposited on the semiconductor substrate 1 by CVD, for example, and a silicon oxide film 16, which serves as an insulating film, is deposited on the silicon nitride film 15. Subsequently, the silicon oxide film 16 and the silicon nitride film 15 on the n⁺-type semiconductor regions 11 (source, drain), p⁺-type semiconductor regions 12 (source, drain), p-type extraction layer 12A and the silicide layer 13 on the gate electrodes 8A are dry-etched to form contact holes 17, and then plugs 18, each constituted by a conductive film, are formed within the contact holes 17. In FIG. 4, the contact hole 17 reaching the silicide layer 13 on each gate electrode 8A and the plug 18 formed in the interior thereof are not shown. In etching the silicon oxide film 16, a hydrofluorocarbon gas or a fluorocarbon gas, such as $CF_4$, $CHF_3$, or $C_4F_8$, is used for decreasing the etching speed of the underlying silicon nitride film 15. The silicon nitride film 15 functions as an etching stopper film. In etching the silicon nitride film 15, a gaseous mixture of a hydrofluorocarbon gas (e.g., $CHF_3$ or $CH_2F_2$) plus oxygen and Ar is used. Each plug 18 is formed by depositing a TiN (titanium nitride) film and W (tungsten) film onto the silicon oxide film 16, including the interior of the associated contact hole 17, by CVD, and then removing unnecessary TiN film and W film on the silicon oxide film 16 by a chemical mechanical polishing (CMP) method or an etch back method. The silicon oxide film 16 may be constituted not only by a silicon oxide film, which is formed by a conventional CVD method using monosilane ($SiH_4$) as a source gas, but also by a BPSG (Boron-doped Phospho Silicate Glass) film, SOG (Spin On Glass) film formed by a spin coating method, or a laminate of both films.

Then, for example a silicon carbide film 19, which serves as an insulating film, is deposited on the silicon oxide film 16, and thereafter a SiOF film and silicon oxide film, which serve as insulating films lower in dielectric constant than the silicon carbide film 19, are deposited successively on the silicon carbide film to form an interlayer insulating film 20. The silicon carbide film 19 functions as an etching stopper film for preventing the underlying silicon oxide film 16 from being etched at the time of forming wiring grooves in the interlayer insulating film 20 in the next step. For example, the silicon carbide film 19 is deposited by a CVD method using a gaseous mixture of a silane-based gas, such as monosilane ($SiH_4$) or disilane ($Si_2H_6$), and ammonia ($NH_3$) or nitrogen gas. For example, the SiOF film is deposited by a plasma CVD method using a gaseous mixture of $SiH_4$, $SiF_4$ and oxygen or a gaseous mixture of tetraethoxysilane ($((C_2H_5))_4Si$), $SiF_4$ and oxygen. The interlayer insulating film 20 can diminish the wiring capacitance of the Cu wiring formed in a later step and having a relative permittivity (about 3.7) smaller than that (4.7) of silicon oxide.

Subsequently, using a photoresist film, which has been subjected to patterning by a photolithography technique, for example, the interlayer insulating film 20 and the silicon carbide film 19 are dry-etched successively to form a wiring groove 22 above each contact hole 17. Next, after removal of the photoresist film, a first-layer buried wiring 24 is formed in the interior of the wiring groove 22. The buried wiring 24 is formed by a laminate of a barrier metal film 24A and a Cu or W film 24B, for example, in the following manner. First, the barrier metal film 24A and Cu (or W) film 24B are deposited on the interlayer insulating film 20, including the interior of the wiring groove 22, and then unnecessary Cu (or W) film 24B and barrier metal film 24A present outside the wiring groove 22 are removed by a chemical mechanical polishing method. In case of using a Cu film, the deposition of the Cu film may be followed by heat treatment (reflow) in a non-oxidizing atmosphere (e.g., hydrogen atmosphere) to bury the Cu film closely into the wiring groove 22.

For polishing the Cu film 24B and the barrier metal film 24A, there is used a polishing slurry containing, as principal components, an abrasive grain, such as alumina, and an oxidizing agent, such as aqueous hydrogen peroxide or an aqueous ferric nitrate solution, of which principal components are dispersed or dissolved in water. After unnecessary Cu film 24B and barrier metal film 24A present outside the wiring groove 22 have been removed by such a chemical mechanical polishing method, a polishing residue of Cu is removed, and thereafter the surface of the buried wiring 24 is modified by a treatment using ammonia plasma, for example. With this treating, it is possible to prevent deterioration of the time dependent dielectric breakdown characteristic between adjacent buried wirings 24.

The barrier metal film 24A has not only the function of preventing diffusion of Cu contained in the buried wiring 24 into the interlayer insulating film 20, but also the function of improving the adhesion between the buried wiring 24 and the interior of the interlayer insulating film 20, and the function of improving the wettability at the time of reflowing the Cu film 24B. As examples of barrier metal films having such functions, there are films of such refractory metals or refractory metal nitrides as TiN, WN (tungsten nitride), TaN (tantalum nitride), TiSiN, and Ta (tantalum), deposited by sputtering or CVD, for example, as well as laminates of those films.

The Cu film 24B, which constitutes the buried wiring 24, is formed by any of such methods as sputtering, CVD, and plating (electrolytic plating or electroless plating). In case of forming the Cu film 24B by plating, a seed layer constituted by a thin Cu film is formed beforehand on the surface of the barrier metal film 24A by sputtering, for example, and then a Cu film is allowed to grown on the surface of the seed layer. In case of forming the Cu film by sputtering, it is preferable to adopt a sputtering method that is high in directivity, such as a long throw sputtering method or a collimate sputtering method. The Cu film 24B may be formed not only by Cu alone, but also by a Cu alloy containing Cu as a main component.

In case of forming the buried wiring 24 of a W film, it can be formed by sputtering or CVD, for example. As examples of the barrier metal film 24A, mention may be made of films of refractory metals or refractory metal nitrides, such as TiN and Ti (titanium) formed by sputtering or CVD, for example, as well as laminates of those films.

Figure 5:
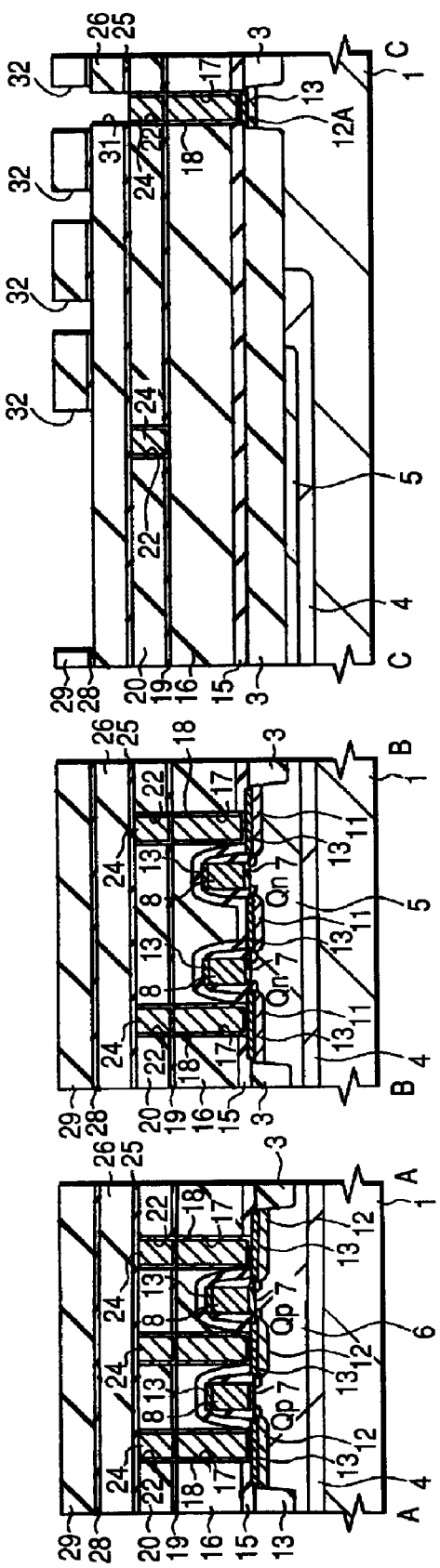
FIG. 5 is a sectional view of a principal portion of the semiconductor integrated circuit device, following the processing shown in FIG. 4.

Next, as shown in FIG. 5, a silicon carbonitride film 25 that is used as an insulating film is deposited on the buried wiring 24 by CVD, for example, and then SiOF film and silicon oxide film as insulating films are deposited successively on the silicon carbonitride film 25 by CVD to form an interlayer insulating film 26. The silicon carbonitride film 25 functions as a diffusion barrier layer for preventing diffusion of Cu contained in the buried wiring 24 into the interlayer insulating film 26. Subsequently, for example, a silicon carbide film (a first insulating film) 28 is deposited as an insulating film on the interlayer insulating film 26 by CVD, and thereafter a SiOF film and silicon oxide film that serve as insulating films are deposited successively on the silicon carbide film 28 by CVD to form an interlayer insulating film (a first insulating film) 29. Then, a silicon nitride film (not shown) that serves as an insulating film is deposited on the interlayer insulating film 29 by CVD. The silicon nitride film thus deposited on the silicon carbide film 28 and the interlayer insulating film 29 functions as an etching stopper layer at the time of forming a wiring groove (32) in the next step.

Thereafter, using a photoresist film which has been subjected to patterning by a photolithography technique, dry etching is performed to remove the silicon nitride film formed on the interlayer insulating film 29 in the wiring groove forming area. After subsequent removal of the photoresist film, the silicon nitride film on the interlayer insulating film 29, the interlayer insulating film 29, silicon carbide film 28 and interlayer insulating film 26, in part of the wiring groove forming area, are removed by dry etching using a newly patterned photoresist film as a mask, and the etching is stopped on the surface of the silicon carbonitride film 25. After subsequent removal of the photoresist film, the interlayer insulating film 29 in the wiring groove forming area is removed by dry etching using the silicon nitride film on the interlayer insulating film as a mask. Then, the silicon nitride film on the interlayer insulating film 29, the silicon carbide film 28 and the silicon carbonitride film 25 are dry-etched to form a connection hole 31 and a wiring groove (first and third wiring grooves) 32 on the buried wiring 24.

Figure 6:
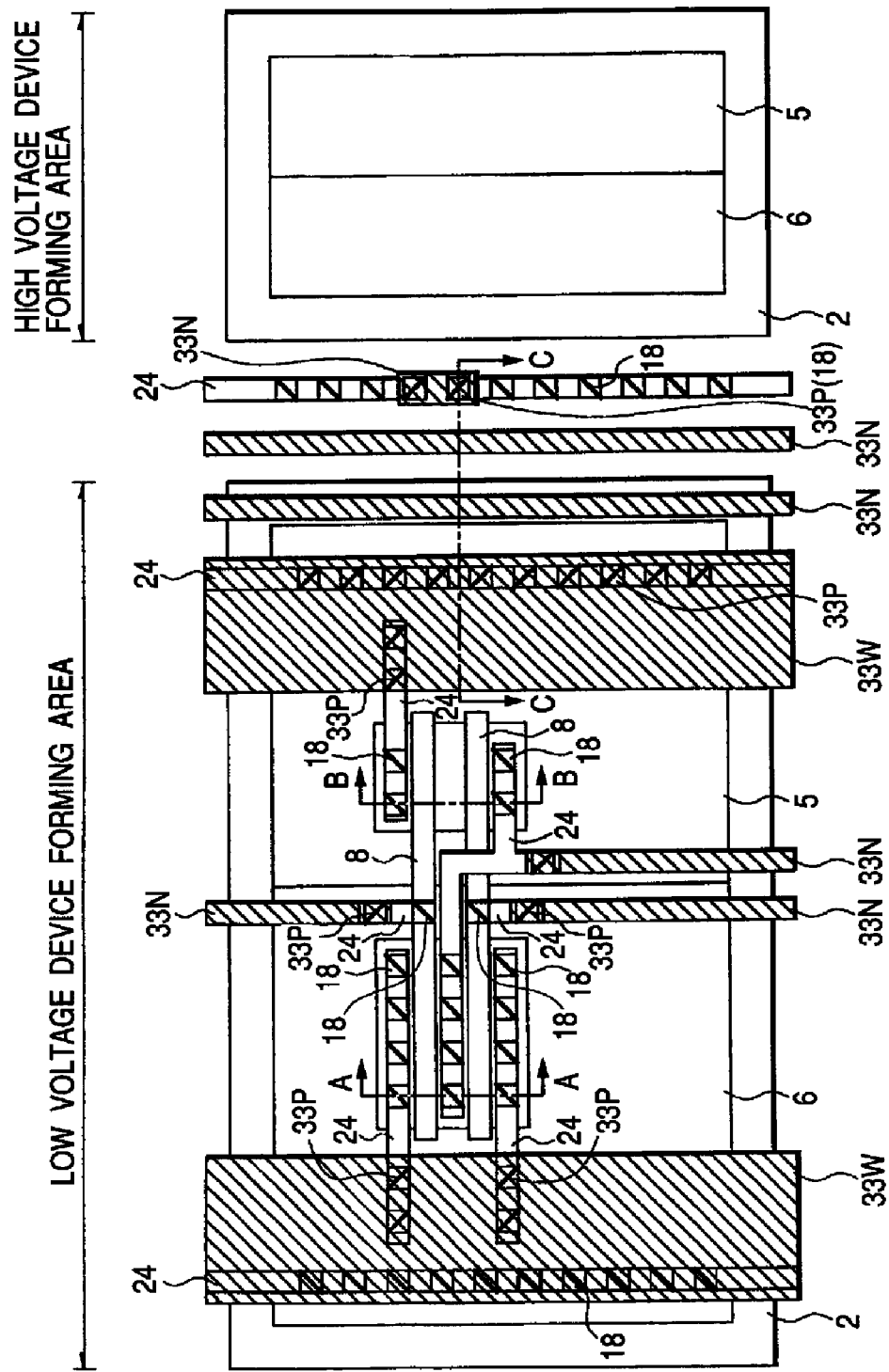
FIG. 6 is a plan view of a principal portion of the semiconductor integrated circuit device according to the first embodiment, as seen during the manufacture thereof.
Figure 7:
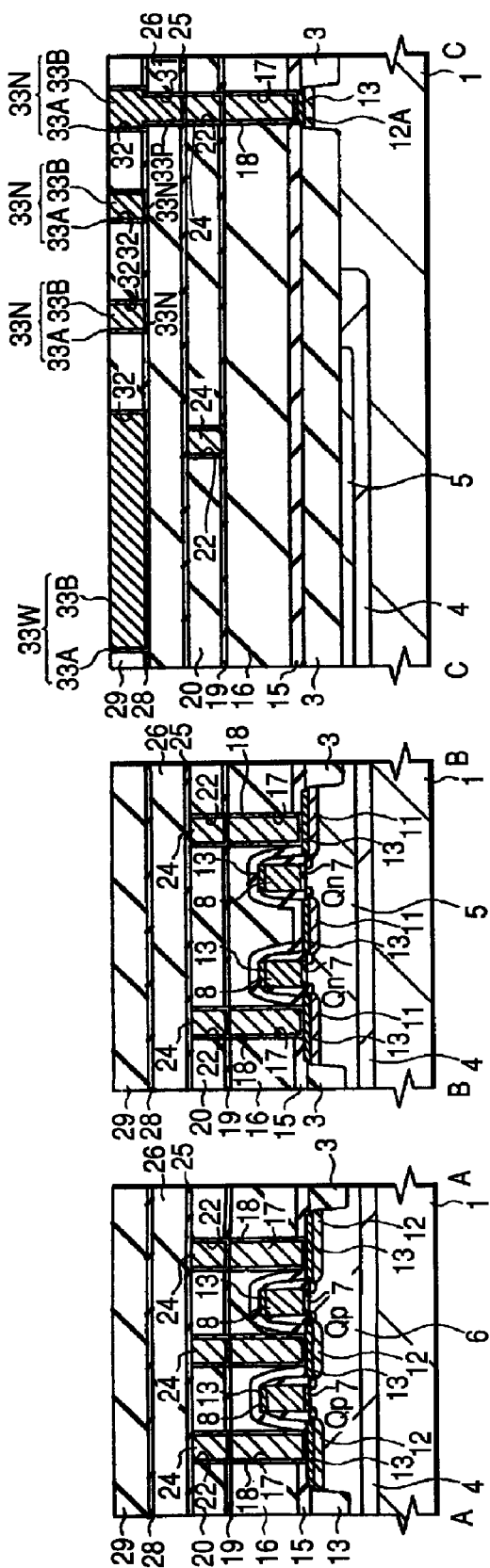
FIG. 7 shows sectional views taken along lines A-A, B-B and C-C in FIG. 6.

Next, as shown in FIGS. 6 and 7, Cu wiring (a first conductive film) 33N and Cu wiring (a first buried wiring) 33W, serving as second-layer buried wirings each consisting of a barrier metal film 33A and Cu film (a first conductive film) 33B, are each formed within the wiring groove 32. At this time, a plug 33P formed by both barrier metal film 33A and Cu film 33B is formed within the connection hole 31 integrally with Cu wirings 33N and 33W. The second-layer Cu wirings 33N and 33W may be formed in accordance with the foregoing method (see FIG. 4) of forming the Cu film 24B which constitutes the first-layer buried wiring 24. In this first embodiment, the Cu wiring 33W is formed at a wiring width which is relatively large with respect to the Cu wiring 33N.

Further, in this first embodiment, the Cu wiring 33N is electrically connected to the potential of the semiconductor substrate 1 through the plug 33P, buried wiring 24, plug 18 and p-type extraction layer 12A, and the Cu wiring 33W is electrically connected to a reference (earth) potential (not shown).

Figure 8:
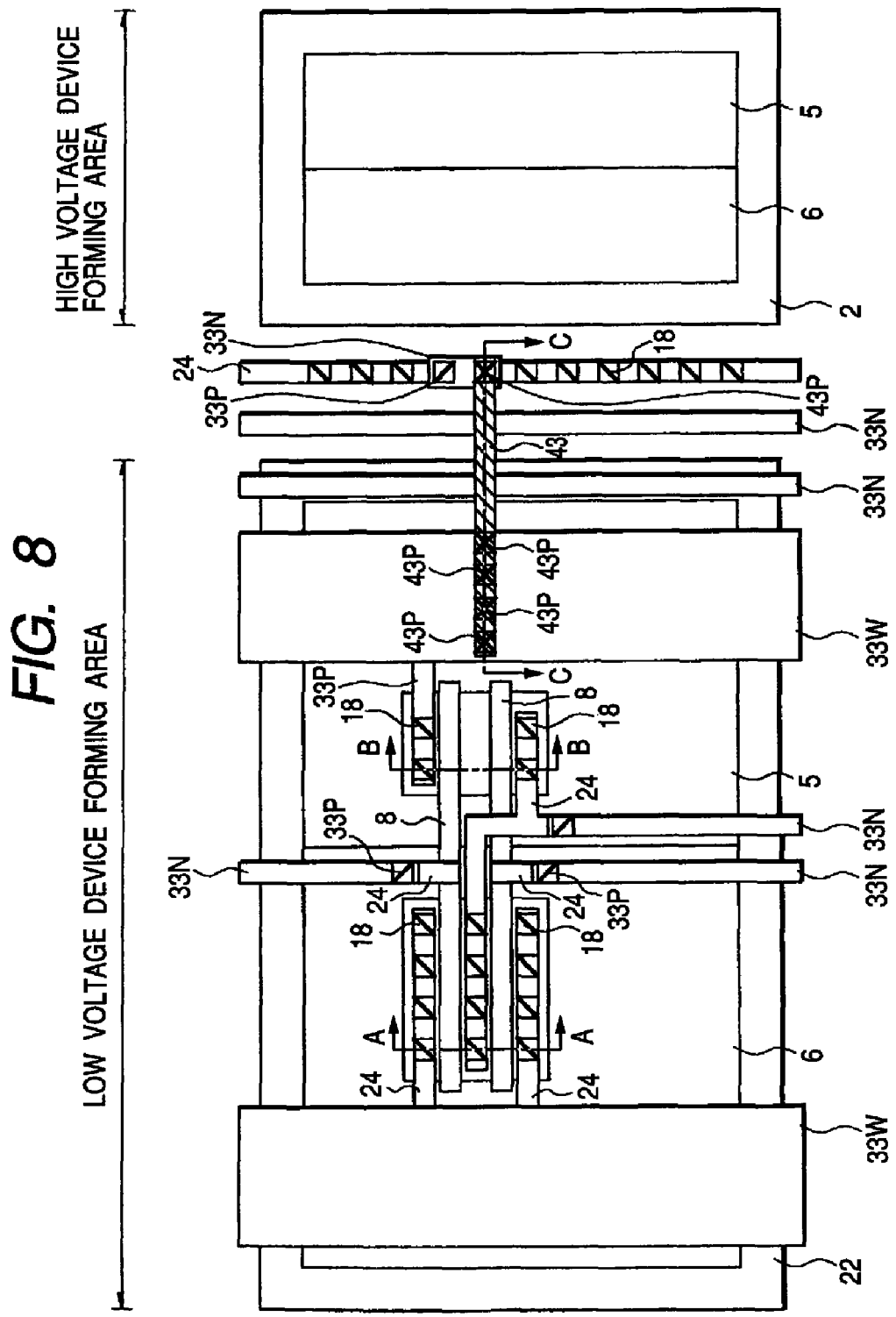
FIG. 8 is a plan view of a principal portion of the semiconductor integrated circuit device, following the processing shown in FIG. 6.
Figure 9:
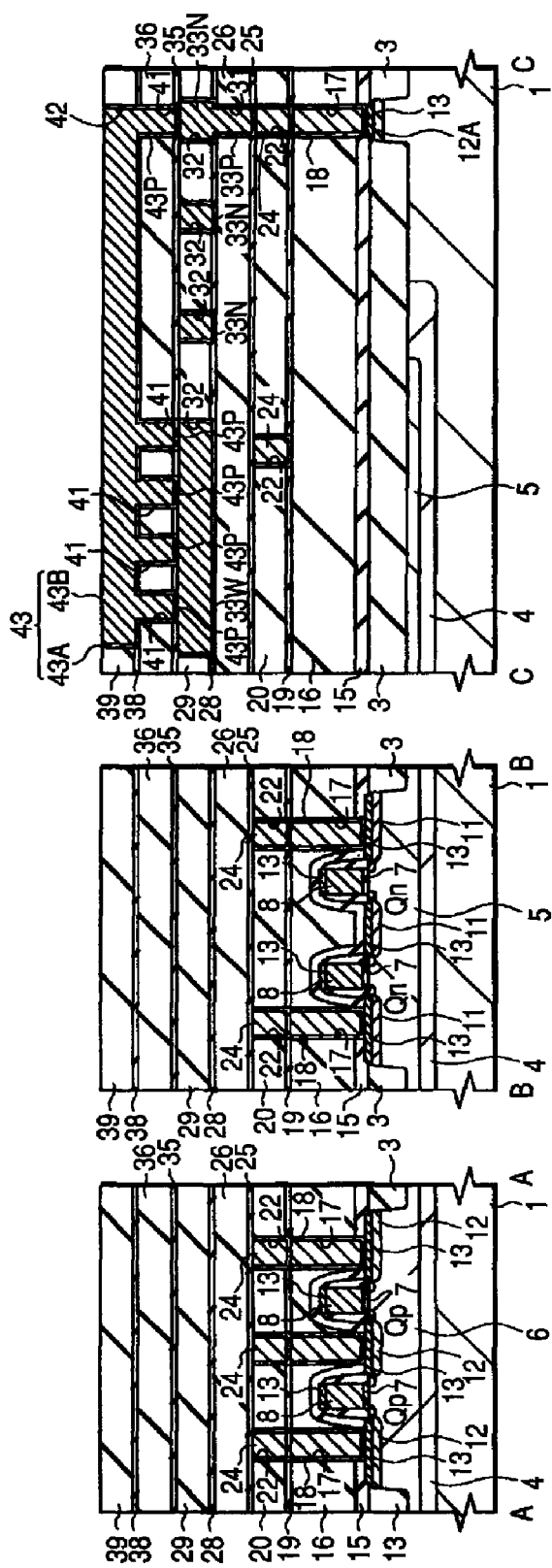
FIG. 9 is a sectional view of a principal portion of the semiconductor integrated circuit device, following the processing shown in FIG. 7.

Then, as shown in FIGS. 8 and 9, a silicon carbonitride film (a second insulating film) 35, an interlayer insulating film (a second insulating film) 36, a silicon carbide film (a third insulating film) 38 and an interlayer insulating film (a third insulating film) 39, which are, for example, the same as the foregoing silicon carbonitride film 25, interlayer insulating film 26, silicon carbide film 28 and interlayer insulating film 29, are deposited successively on the Cu wirings 33N and 33W. Subsequently, a silicon nitride film is deposited on the interlayer insulating film 39, and a connection hole (a first hole) 41 and a wiring groove (a second wiring groove) 42 are formed on the Cu wirings 33N and 33W by the same step as the foregoing step of forming the connection hole 31 and the wiring groove 32. Next, Cu wiring (a second buried wiring) 43, which serves as a third-layer buried wiring consisting of a barrier metal film 43A and Cu film (a third conductive film) 43B, is formed within the wiring groove 42. At this time, a plug (first and second plugs) 43P consisting of both barrier metal film 43A and Cu film 43B is formed within the connection hole 41 integrally with the Cu wiring 43. The third-layer Cu wiring 43 may be formed in accordance with the foregoing method (see FIG. 4) of forming the Cu film 24B, which constitutes the first-layer buried wiring 24. Through the Cu wiring 43, there is established an electrical connection between the Cu wiring 33N and the Cu wiring 33W.

Although the above description in this first embodiment refers to a case where the plug 43P and the Cu wiring 43 are integrally formed, a method may be adopted wherein, subsequent to the step of depositing the interlayer insulating film 36, the interlayer insulating film 36 and the silicon carbonitride film 35 are etched to form a connection hole 41, then a plug 43P consisting of the barrier metal film and Cu film (a second conductive film) is formed within the connection hole 41, thereafter a silicon carbide film 38 and an interlayer insulating film 39 are deposited successively, followed by etching the interlayer insulating film 39 and the silicon carbide film 38 to form a wiring groove 42, and Cu wiring 43 consisting of the barrier metal film and Cu film (a third conductive film) is formed within the wiring groove 42. Also, in this case, the plug 43P and the Cu wiring 43 may be formed in accordance with the foregoing method (see FIG. 4) of forming the Cu film 24B, which constitutes the first-layer buried wiring 24.

Though not shown, on the Cu wiring 43 which serves as the third-layer buried wiring, there are formed a fourth-layer buried wiring and a fifth-layer buried wiring, both using Cu as a main conductive layer in the same manner as is the case with Cu wiring 43. For attaining a high integration level, the wiring width of each of the first to third layer signal wirings is set to be smaller than the wiring width of each of the fourth and fifth layer signal wirings. Consequently, the diameter of the plug which connects the fourth and fifth layer Cu wirings with each other electrically is set to be larger than that of the plug 43P, which connects the second and third layer Cu wirings with each other electrically.

Figure 10:
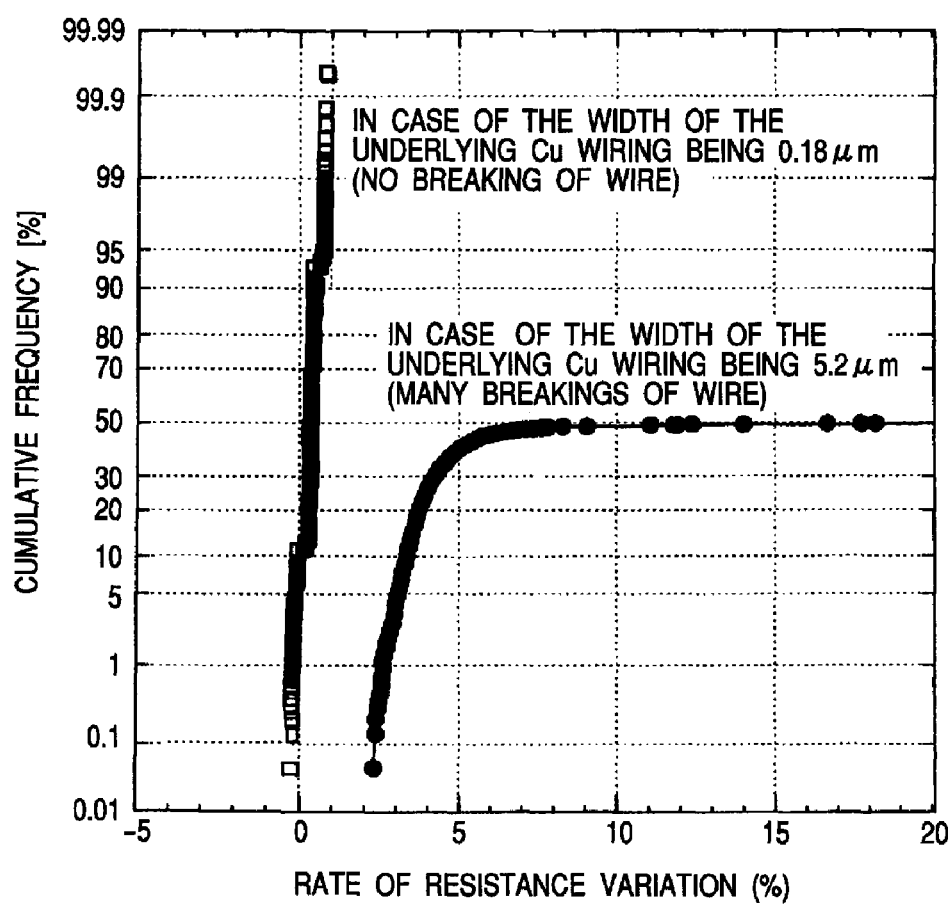
FIG. 10 is a graph showing, for each of different widths of lower-layer wirings, a relation between an upper-/lower-layer wiring resistance variation rate and a cumulative frequency of resistance variation measurement points, determined experimentally by the present inventors.

Many vacant holes (atom-free holes) are dotted in the films of the buried wiring 24 and Cu wirings 33N, 33W, 43. Such vacant holes migrate to the interface between the wiring surface and the plug connected thereto due to the stress migration phenomenon. The present inventors have conducted a high-temperature shelf test (stress migration test) for the semiconductor substrate 1 formed with the buried wiring 24 and Cu wirings 33N, 33W, 43; and, with respect to the Cu wiring 33W and Cu wiring 43, as an example, they have checked the resistance variation rate between the Cu wirings 33W and 43 and the cumulative frequency of the resistance variation measurement points. FIG. 10 shows a relation between such resistance variation rate and cumulative frequency. In this case, the wiring width of the Cu wiring 43 is about 0.18 μm and the number of plug 43P present between the Cu wirings 33W and 43 is only one. The quantity of vacant holes present in the surface of the Cu wiring 33W is proportional to the wiring width (surface area of wiring) of the Cu wiring, so that, in the case where the width of the underlying Cu wiring 33W is about the same (about 0.18 μm) as that of the overlying Cu wiring 43, as shown in FIG. 10, and if the width of the Cu wiring 33W is larger (e.g., about 5.2 μm) than that of the Cu wiring 43 in connecting these wirings with the plug 43P (diameter about 0.18 μm), the incremental quantity of the resistance variation rate becomes large to a great extent relative to that of the cumulative frequency of resistance variation measurement points. It is seen that, in the case where the width of the Cu wiring 33W is larger than that of the Cu wiring 43, vacant holes dotted in the film of the Cu wiring 33W gather in the interface between the Cu wiring 33W and the plug 43P due to stress migration, forming a large void, and thus discontinuity (breaking of wire) is apt to occur between the Cu wirings 33W and 43. Although reference is made to the case where the width of the underlying Cu wiring 33W is larger than that of the overlying Cu wiring 43, no limitation on the invention is to be understood from this. Also, in the case where the width of the Cu wiring 33W is about the same (about 0.18 μm) as the diameter of the plug 43P and is smaller than the width (about 5.2 μm) of the overlying Cu wiring 43, or in the case where the width of the Cu wiring 33W and that of the overlying Cu wiring 43 are large (about 5.2 μm) relative to the plug 43P (diameter about 0.18 μm), there is a tendency that the incremental quantity of the resistance variation rate becomes large to a great extent relative to an incremental quantity of the cumulative frequency of the resistance variation measurement points. This tendency is marked particularly when the width of the underlying Cu wiring 33W is large relative to the diameter of the plug 43P. This indicates that, in the case where the width of the upper- or lower-layer wiring is large relative to the diameter of the plug 43P, voids are apt to gather at the bottom of the plug 43P, causing the occurrence of a discontinuity (breaking of the wire).

Figure 11:
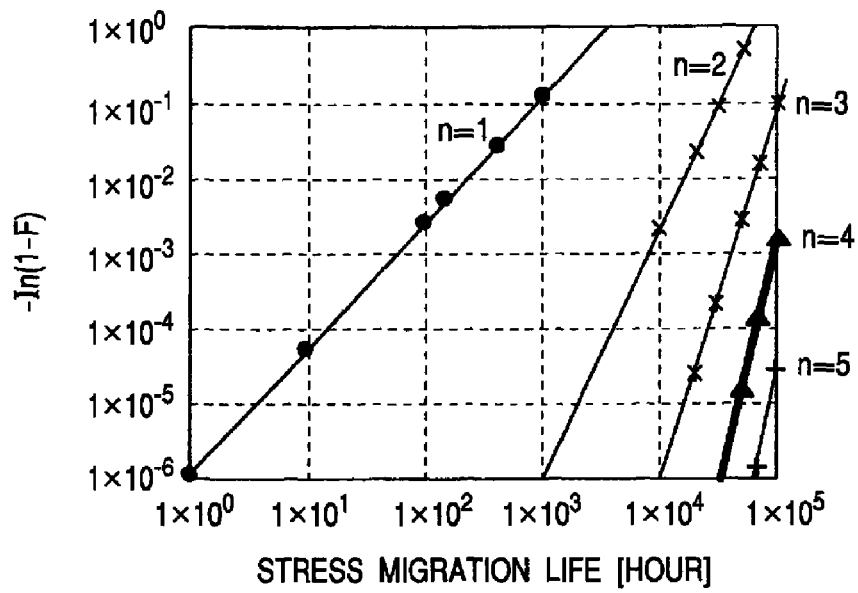
FIG. 11 is a graph showing, for each of different numbers of plugs between an upper-layer wiring and a lower-layer wiring, a relation between an upper-/lower-layer wiring stress migration life and a cumulative defect rate, determined on the basis of calculation performed by the present inventors.

If the diameter of the plug 43P is made almost equal to the width of the Cu wiring 43 and the occurrence of a failure (discontinuity) between the Cu wirings 33W and 43 is assumed to be a completely independent event, then according to the rule of probability product, the failure probability in case of the number of the plug 43P being n is the $n^{th}$ power of the failure probability in case of the number of that plug being one. Therefore, if a cumulative defect rate (failure probability) in the case of the number of the plug 43P being n is expressed by a function F of the number n of the plug 43P and the elapsed time t, there can be obtained an equation of $F(n, 1; t) = F(1, 1; t)^n$. Further, if N number of such combinations of Cu wirings 33W and 43, as described above, are present within the semiconductor chip on which the semiconductor integrated circuit device of this first embodiment is formed, the combination number N can be added to the function F to obtain a cumulative defect rate of the semiconductor chip. That is, since there exists $1-F(n, N; t) = \{1-F(n, 1; t)\}^N$, there can be written $1-F(n, N; t) = \{1-F(1, 1; t)^n\}^N$. FIG. 11 shows a relation between the life (designated "stress migration life") until the occurrence of a discontinuity caused by stress migration between the Cu wirings 33W and 43 in case of N being 500 and the function F, the relation being shown with respect to each of the cases of n being 1~4. In FIG. 11, if a comparison is made between the case where n is 1 and the case where n is 2, at a function F of $1 \times 10^{-3}$, it is seen that the stress migration life in case of n being 2 is improved about $1 \times 10^2$ times as long as the stress migration life in case of n being 1. Likewise, from a comparison between the case of n being 1 and the case of n being 4 at a function F of $1 \times 10^{-3}$, it is seen that the stress migration life in case of n being 4 is improved about $1 \times 10^3$ times as long as the stress migration life in case of n being 1. Thus, a stress migration life of about ten years (87600 hours) ca be realized.

Figure 12:
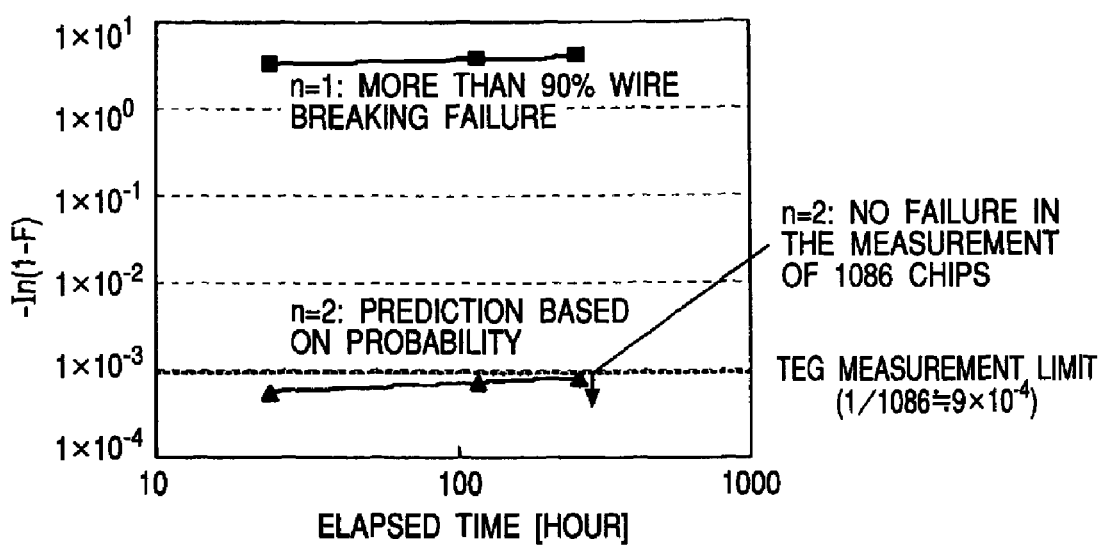
FIG. 12 is a graph showing a relation between an upper-/lower-layer wiring cumulative defect rate and elapsed time, determined on the basis of calculation performed by the present inventors.

FIG. 12 shows a relation between elapsed time and the function F in case of n being 2, which relation has been determined on the basis of measured values of the cumulative defect rate relative to elapsed time in the case of the n being 1 and N being 20000, as well as the above equation. It is here assumed that 1086 semiconductor chips with the semiconductor integrated circuit device of this first embodiment formed thereon can be obtained from a single semiconductor wafer (semiconductor substrate 1) and that a minimum value of $-\ln(1-F)$ capable of being measured by a test using TEG (Test Element Group) is $1/1086$ ($\approx 9 \times 10^{-4}$). As shown in FIG. 12, in case of n being 1 and even if a discontinuity caused by stress migration occurs in about 90% or more of Cu wiring 33W-43 combinations, the occurrence of a discontinuity caused by stress migration between Cu wirings 33W and 43 can be suppressed within a single semiconductor wafer by setting n to 2.

Figure 13:
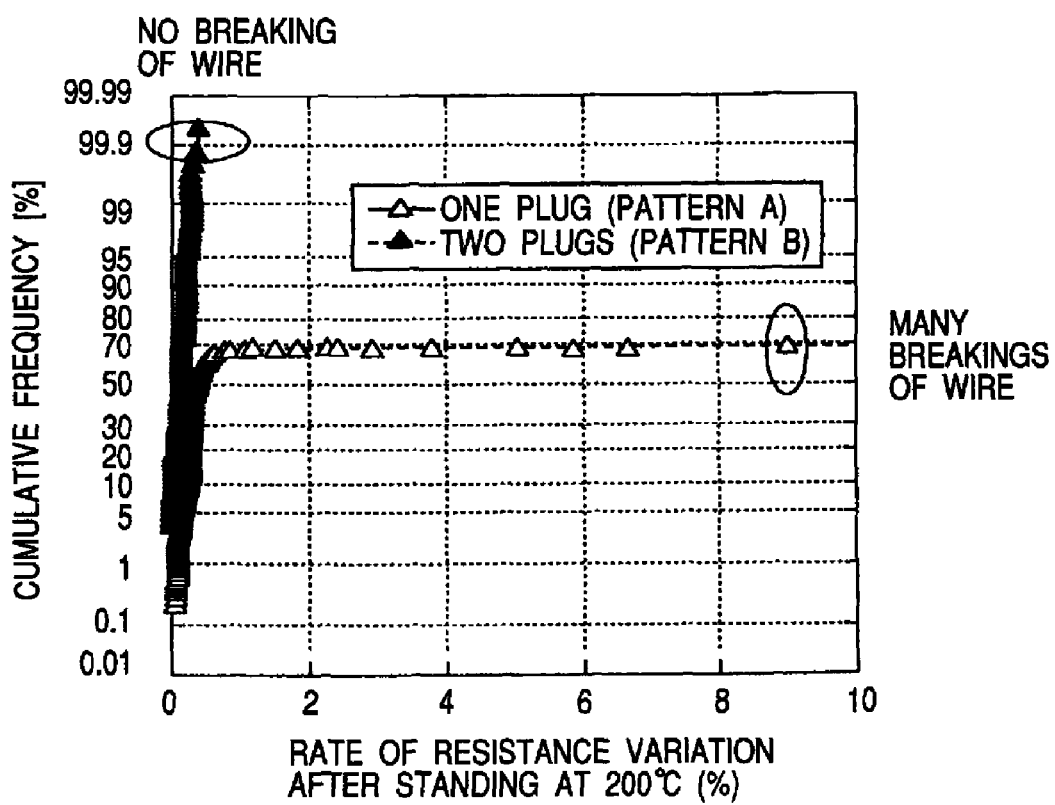
FIG. 13 is a graph showing, for each of different numbers of plugs between an upper-layer wiring and a lower-layer wiring, a relation between an upper-/lower-layer wiring resistance variation rate and a cumulative frequency of resistance variation measurement points, determined on the basis of a high-temperature shelf test performed by the present inventors.

FIG. 13 shows a relation between the resistance variation rate between the Cu wirings 33W and 43 and the cumulative frequency of the resistance variation measurement points, the resistance variation rate being determined after performing a stress migration test involving heating at about 200° C. for the semiconductor substrate 1, with the plural Cu wirings 33W, 43 and plugs 43P formed on the main surface (semiconductor element forming surface). The relation illustrated therein covers both the case where one plug 43P is disposed between the Cu wirings 33W and 43 and the case where two plugs 43P are disposed between those Cu wirings. It is here assumed that the number N of combinations between the Cu wirings 33W and 43 is 20000. FIGS. 13 to 17 show results obtained by using two patterns (A and B) for the plug 43P. As shown in FIG. 13, in the case where one plug 43P is disposed between the Cu wirings 33W and 43 (pattern A), the resistance variation rate between the Cu wirings 33W and 43 increases to a great extent with an increase in the cumulative frequency of resistance variation measurement points. This indicates that many discontinuities (breakings of wire) occur between the Cu wirings 33W and 43. On the other hand, in the case where two plugs 43P are disposed between the Cu wirings 33W and 43 (pattern B), the change of the resistance variation rate between the Cu wirings 33W and 43 relative to an increase in the cumulative frequency of resistance variation measurement points is much smaller than in the case of the number of plugs 43P being one. This indicates that there scarcely occurs any discontinuity (breaking of wire) between the Cu wirings 33W and 43. Thus, also from the results of the stress migration test it is seen that the occurrence of a discontinuity (breaking of wire) between the Cu wirings 33W and 43 can be suppressed by disposing plural plugs 43P between those wirings.

Figure 14:
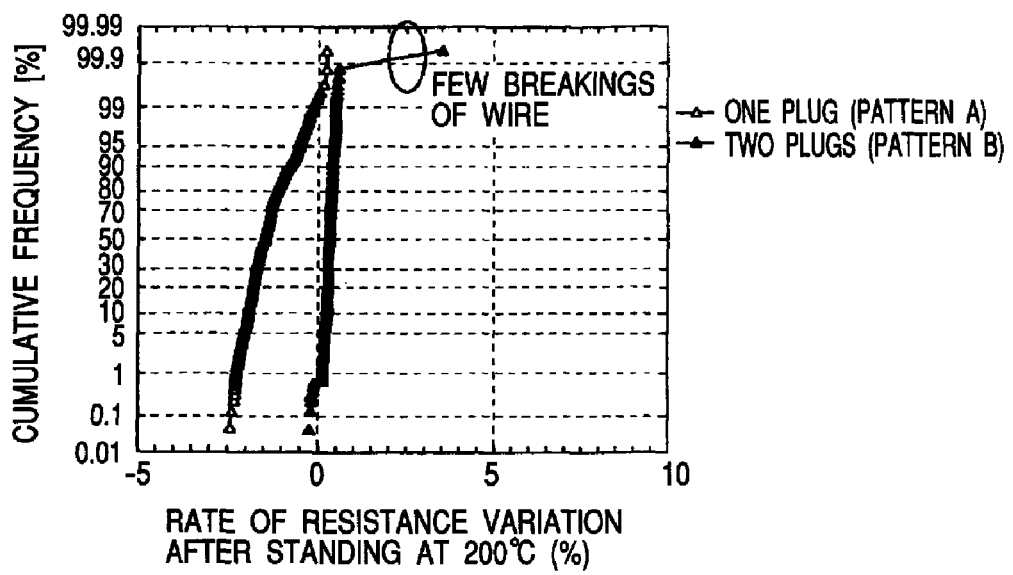
FIG. 14 is a graph showing a relation between an upper-/lower-layer wiring resistance variation rate which is based on a plug position between an upper-layer wiring and a lower-layer wiring and a cumulative frequency of resistance variation measurement points, determined on the basis of a high-temperature shelf test performed by the present inventors.
Figure 15:
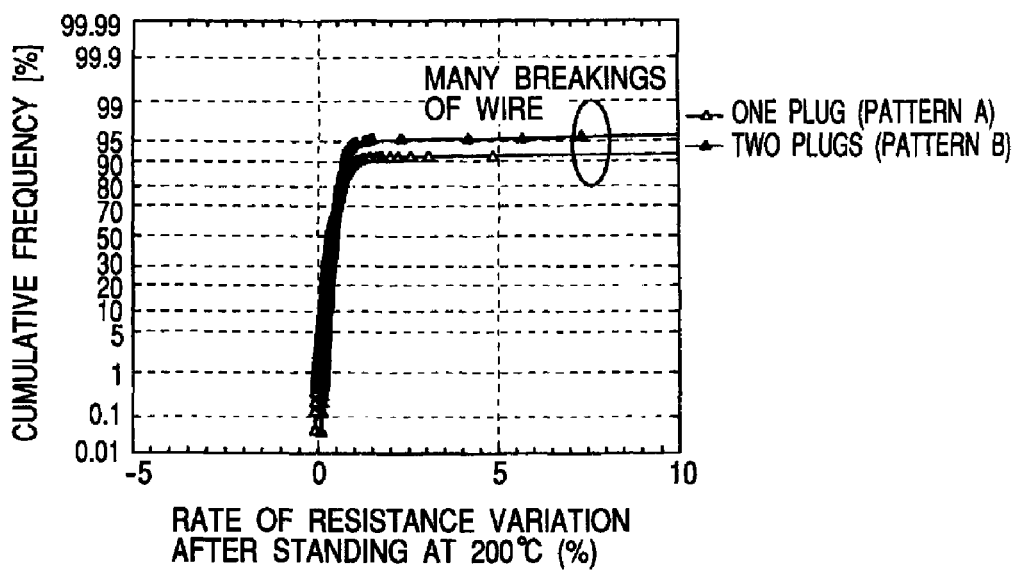
FIG. 15 is a graph showing a relation between an upper-/lower-layer wiring resistance variation rate which is based on a plug position between an upper-layer wiring and a lower-layer wiring and a cumulative frequency of resistance variation measurement points, determined on the basis of a high-temperature shelf test performed by the present inventors.

FIGS. 14 and 15 show a relation between the resistance variation rate between the Cu wirings 33W and 43 and the cumulative frequency of the resistance variation measurement points, the resistance variation rate being determined after performing a stress migration test involving heating at about 200° C. for the semiconductor substrate 1 with the plural Cu wirings 33W, 43 and plugs 43P formed on the main surface. The relation illustrated therein covers both the case where one plug 43P is disposed between the Cu wirings 33W and 43 (pattern A) and the case where two plugs 43P are disposed between those wirings. In this connection, it is assumed that the width of the Cu wiring 33W is about 5.2 μm, that of the Cu wiring 43 is 0.18 μm, and that the number N of combinations between the Cu wirings 33W and 43 is 1200. FIG. 14 shows results obtained when a plug 43P was disposed at a position of about 0.09 μm from an end in the width direction (orthogonal to the extending direction of the Cu wiring 33W) of the Cu wiring 33W (pattern A) (in case of two plugs 43P being disposed, the distance up to a plug 43P located close to an end in the width direction of the Cu wiring 33W is about 0.09 μm (pattern B)). On the other hand, FIG. 15 shows results obtained when a plug 43P was disposed at a position of about 2.6 μm from an end in the width direction of the Cu wiring 33W (pattern A) (in case of two plugs 43P being disposed, the distance up to a plug 43P located close to an end in the width direction of the Cu wiring 33W is about 2.6 μm (pattern B)). As shown in FIG. 15, when a plug 43P is disposed at a position of about 2.6 μm from an end in the width direction of the Cu wiring 33W, the resistance variation rate between the Cu wirings 33W and 43 increases to a great extent with an increase in the cumulative frequency of the resistance variation measurement points. This indicates that many discontinuities (breakings of wire) occur between the Cu wirings 33W and 43. On the other hand, in the case where a plug 43P is disposed at a position of about 0.09 μm from an end in the width direction of the Cu wiring 33W, an incremental quantity of the variation resistance rate between the Cu wirings 33W and 43 relative to an increase in the cumulative frequency of the resistance variation measurement points is much smaller than in the case shown in FIG. 15. Thus, from the results shown in FIGS. 14 and 15, it is seen that the occurrence of a discontinuity caused by stress migration between the Cu wirings 33W and 43 increases as the installed position of plug 43P approaches the central portion away from an end in the width direction of the Cu wiring 33W.

Figure 16:
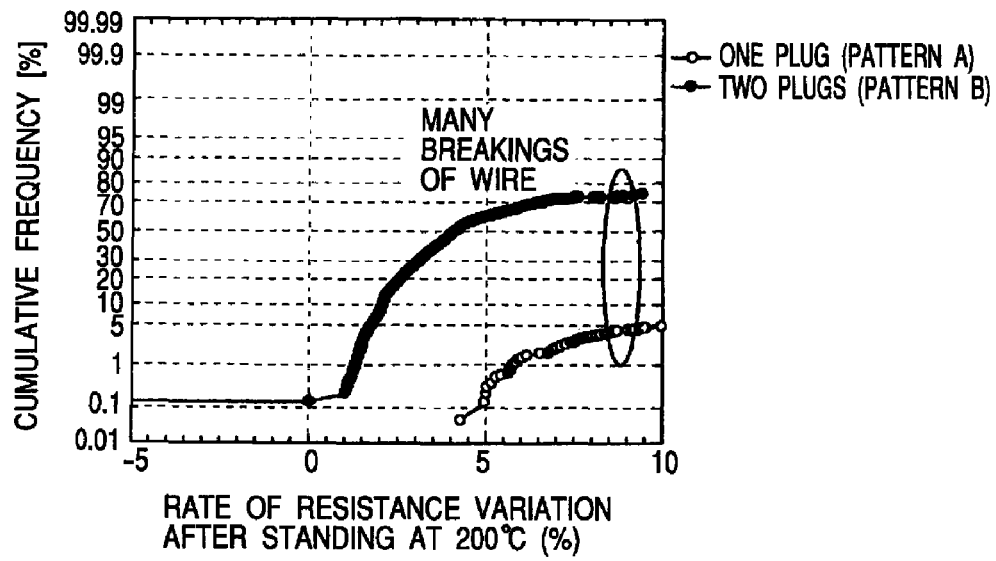
FIG. 16 is a graph showing a relation between an upper-/lower-layer resistance variation rate, which is based on a plug diameter between an upper-layer wiring and a lower-layer wiring, and a cumulative frequency of the resistance variation measurement points, determined on the basis of a high-temperature shelf test performed by the present inventors.
Figure 17:
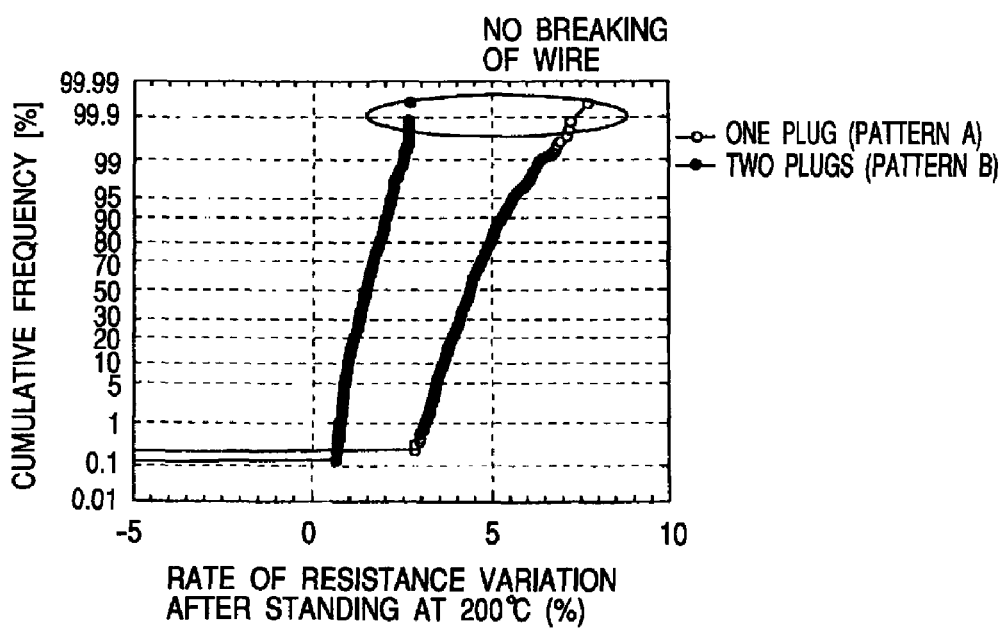
FIG. 17 is a graph showing a relation between an upper-/lower-layer wiring resistance variation rate, which is based on a plug diameter between an upper-layer wiring and a lower-layer wiring, and a cumulative frequency of the resistance variation measurement points, determined by a high-temperature shelf test performed by the present inventors.

FIGS. 16 and 17 show a relation between the resistance variation rate between the Cu wirings 33W and 43 and the cumulative frequency of the resistance variation measurement points, the resistance variation rate being determined after performing a stress migration test involving heating at about 200° C. for the semiconductor substrate 1 with the plural Cu wirings 33W, 43 and plugs 43P formed on the main surface. The illustrated relation covers both the case where one plug 43P is disposed between the Cu wirings 33W and 43 (pattern A) and the case where two plugs 43P are disposed between those wirings (pattern B). In this connection, it is assumed that the width of the Cu wiring 33W is about 5.2 μm, that of the Cu wiring 43 is 0.18 μm, and that the number N of combinations between the Cu wirings 33W and 43 is 1200. FIG. 16 shows results obtained with the diameter of plug 43P set at about 0.18 μm and FIG. 17 shows results obtained with the diameter of plug 43P set at about 0.36 μm. As shown in FIG. 16, when the diameter of plug 43P is set at about 0.18 μm, the resistance variation rate between the Cu wirings 33W and 43 increases to a great extent with an increase in the cumulative frequency of the resistance variation measurement points. This indicates that many discontinuities (breakings of wire) occur between the Cu wirings 33W and 43. On the other hand, as shown in FIG. 17, when the diameter of plug 43P is set at about 0.36 μm, an incremental quantity of the resistance variation rate between the Cu wirings 33W and 43 relative to an increase in the cumulative frequency of the resistance variation measurement points is much smaller than in the case of the diameter of plug 43P being set at about 0.18 μm. Thus, from the results shown in FIGS. 16 and 17, it is seen that the area of contact between the plug 43P and the Cu wiring 33W increases with an increase in diameter of the plug 43P, so that the resistance to discontinuity caused by stress migration becomes stronger between the Cu wirings 33W and 43. That is, discontinuity caused by stress migration becomes easier to occur as the diameter of plug 43P becomes smaller than about 0.36 μm.

In this first embodiment, the method used to dispose the plug 43P which connects the Cu wirings 33W and 43 is defined as follows, taking into account the various elements described above in connection with FIGS. 10 to 17. In the following definition, it is assumed that the width of the Cu wiring 43 is about 0.18 μm and the diameter of the plug 43P is also about 0.18 μm, unless otherwise specified.

For example, if the width of the Cu wiring 33W (including Cu wiring 33N) is about 0.9 μm or less, only one plug 43P is disposed. As noted earlier, a discontinuity caused by stress migration is easier to occur as the width of the Cu wiring 33W becomes larger relative to the diameter of the plug 43P. Therefore, in the case where the width of the Cu wiring 33W is smaller than a predetermined value, only one plug 43P is provided because there is little fear of such a discontinuity. Further, since many vacant holes, which are a cause of discontinuity due to stress migration, are present in the film of Cu wiring 33W and gather at the plug 43P-Cu wiring 33W interface from all directions, it is preferable that the plug 43P be disposed so as to be connected to the Cu wiring 33W without disalignment at a position (first position) close to an end in the width direction of the Cu wiring 33W. As a result, at the position where the plug 43P is disposed, it is possible to prevent concentration of voids from the end in the width direction of the Cu wiring 33W, whereby, as noted previously in connection with FIGS. 14 and 15, it is possible to prevent the occurrence of a discontinuity due to stress migration between the Cu wirings 33W and 43.

Figure 18:
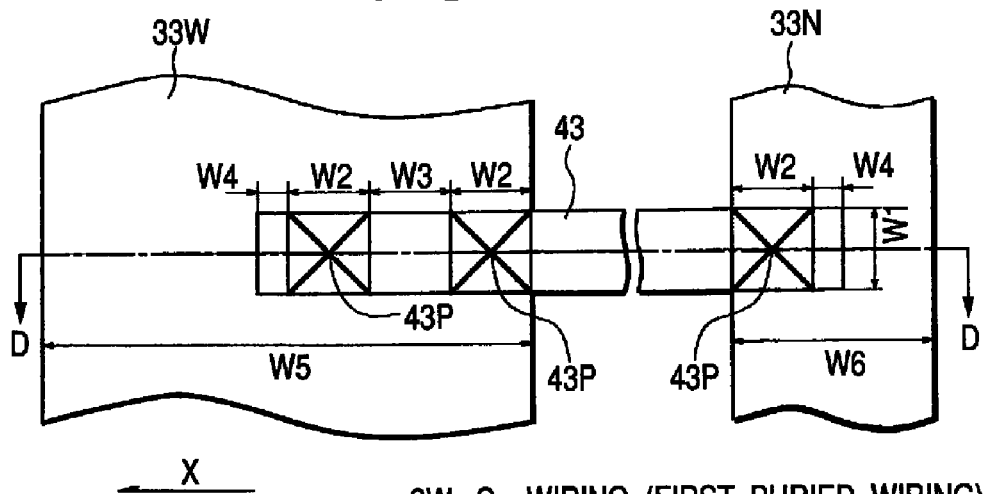
FIG. 18 is a plan view of a principal portion of the semiconductor integrated circuit device according to the first embodiment, as seen during the manufacture thereof.
Figure 19:
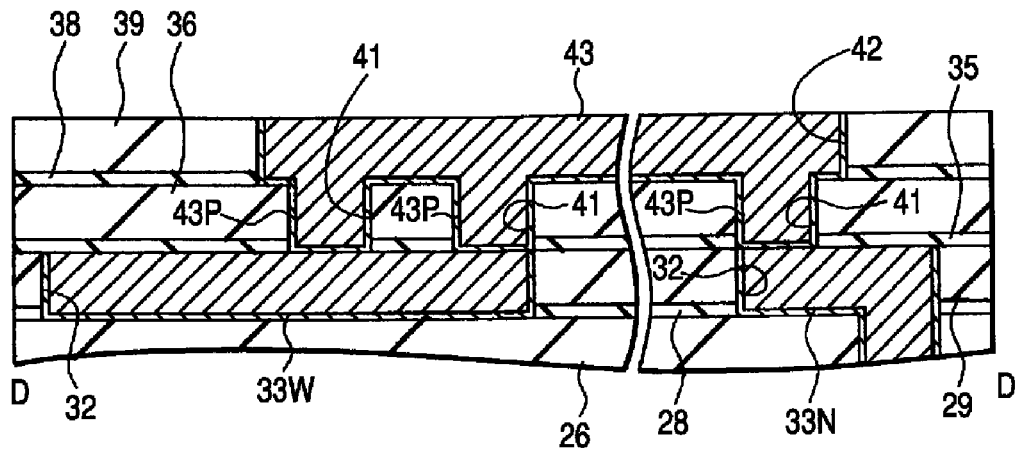
FIG. 19 is a sectional view taken along line D-D in FIG. 18.

For example, if the width of the Cu wiring 33W is not smaller than about 0.9 μm and is smaller than about 1.44 μm, two or more plugs 43P are disposed on the Cu wiring 33W, as shown in FIGS. 18 and 19. FIGS. 18 and 19 illustrate a case where two plugs 43P are disposed, FIG. 19 being a sectional view taken along line D-D in FIG. 18. In FIG. 18, W1 denotes the width of Cu wiring 43, W2 denotes the diameter of plug 43P, W3 denotes the distance between adjacent plugs 43P, W4 denotes an arrangement margin distance of the plug 43P from an end of the Cu wiring 43 in the extending direction (the direction indicated by X) of the Cu wiring 43, W5 denotes the width of Cu wiring 33W, and W6 denotes the width of Cu wiring 33N. For example, W3 is set at about 0.18 μm, equal to the diameter of plug 43P, and W4 is set at about 0.06 μm. In this first embodiment, if the width of Cu wiring 33W is not smaller than about 0.9 μm and is smaller than about 1.44 μm, then even if there are two or more plugs 43P connected to the Cu wiring 33W, there is little influence on the size of the cell which forms the semiconductor integrated circuit device of this first embodiment. Therefore, two or more plugs 43P connected to the Cu wiring 33W can be arranged easily. As noted earlier in connection with FIG. 13, even when the width of Cu wiring 33W is large and there is a fear that a discontinuity (breaking of wire) is apt to occur due to stress migration between the Cu wirings 33W and 43, if there are two or more plugs 43P between the Cu wirings 33W and 43, the gathering of voids which causes discontinuity due to stress migration can be dispersed to the arranged portions of the plural plugs 43P, whereby the occurrence of such a discontinuity can be prevented. That is, it is possible to prolong the time (stress migration time) until the occurrence of a discontinuity between the Cu wirings 33W and 43.

Further, since vacant holes, which are a cause of a discontinuity due to stress migration, gather from all directions in the film of the Cu wiring 33W, which is centered at the plug 43P-Cu wiring 33W interface, it is preferable that one of the plugs 43P is disposed so as to be connected to the Cu wiring 33W without disalignment at a position close to an end in the width direction (the direction indicated by X) of the Cu wiring 33W. More specifically, the plug 43P is disposed in such a manner that the center of its diameter is displaced a half or more of an alignment margin in the width direction of the Cu wiring 33W from a central portion in the same direction. By so doing, at the position where the plug 43P is disposed, it is possible to prevent a concentration of vacant holes from an end in the width direction of the Cu wiring 33W, and, hence, it is possible to suppress the occurrence of a discontinuity caused by stress migration between the Cu wirings 33W and 43, as noted previously in connection with FIGS. 14 and 15.

Figure 20:
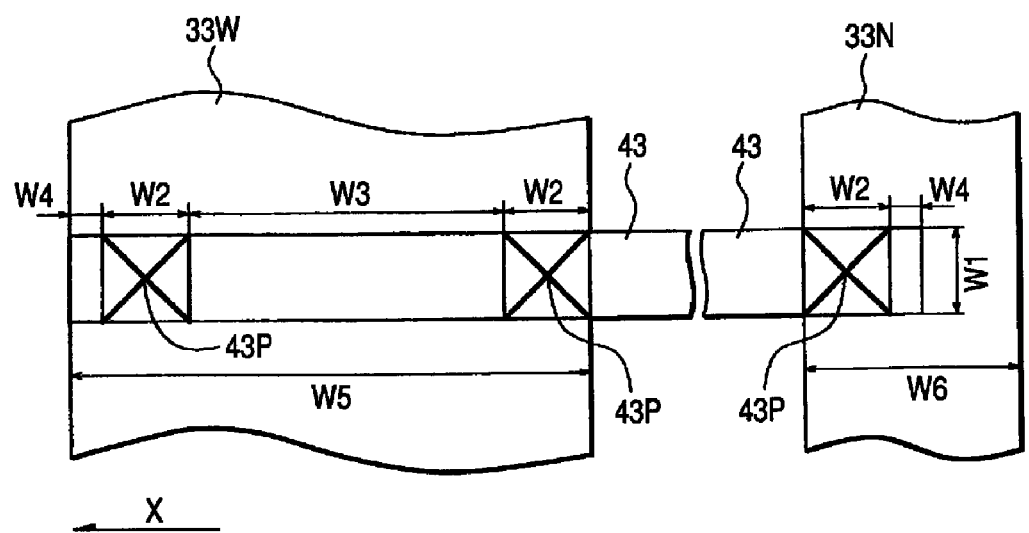
FIG. 20 is a plan view of a principal portion of the semiconductor integrated circuit device according to the first embodiment, as seen during the manufacture thereof.

Moreover, as shown in FIG. 20, it is preferable that both plugs 43P be disposed so as to be connected to the Cu wirings 33W without disalignment at positions close to both ends in the width direction (X direction) of the Cu wiring 33W. More specifically, both plugs 43P are arranged in such a manner that the center of the diameter of each of them is displaced a half or more of an alignment margin in the width direction of the Cu wiring 33W from a central portion in the same direction. In this way, at the positions where both plugs 43P are arranged, it is possible to prevent a concentration of vacant holes from an end in the width direction of the Cu wiring 33W, so that, as noted earlier in connection with FIGS. 14 and 15, it is possible to suppress the occurrence of a discontinuity caused by stress migration between the Cu wirings 33W and 43.

Figure 21:
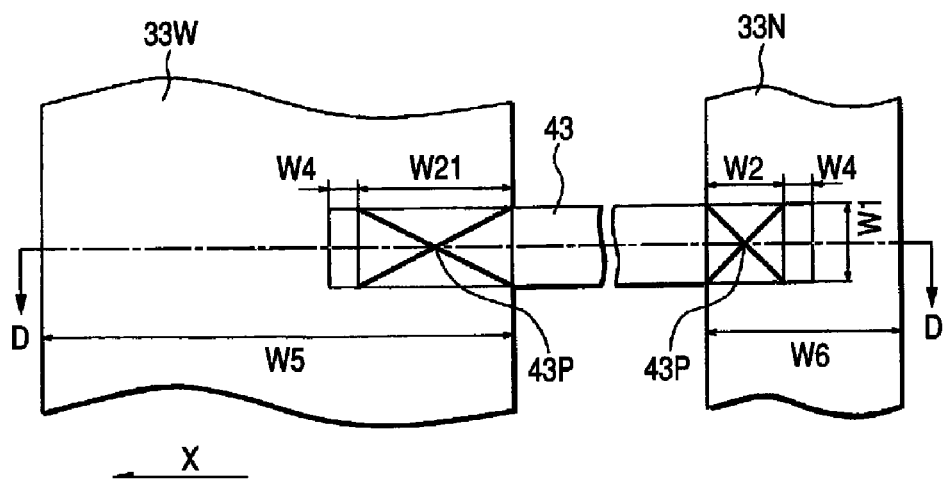
FIG. 21 is a plan view of a principal portion of the semiconductor integrated circuit device according to the first embodiment, as seen during the manufacture thereof.
Figure 22:
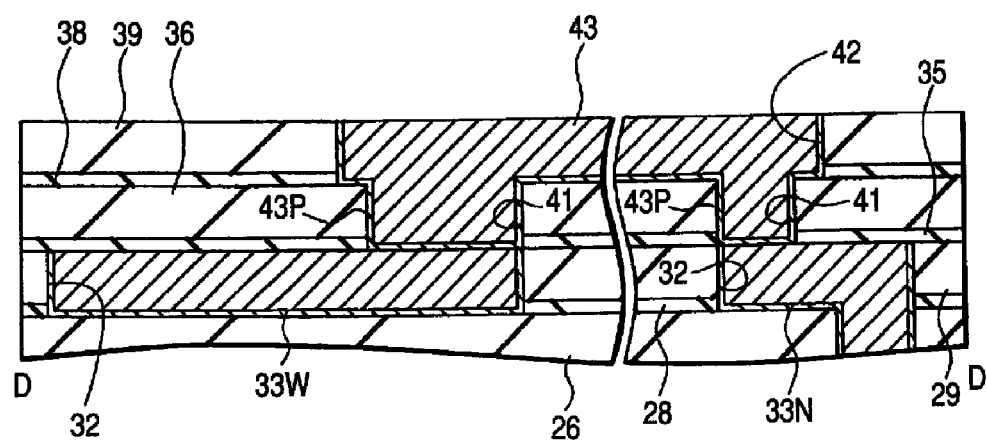
FIG. 22 is a sectional view taken along line D-D in FIG. 21.

Instead of disposing two plugs 43P on the Cu wiring 33W, as shown in FIGS. 18 and 19, one may adopt a construction such as shown in FIGS. 21 and 22 in which the number of plugs 43P disposed on the Cu wiring 33W is one, provided its diameter W21 in the extending direction (X direction) of the Cu wiring 43 is enlarged. For example, the diameter W21 is made about twice (about 0.36 μm) as large as the width W1 of the Cu wiring 43. By disposing such a large-diameter plug 43P, the area of contact between the plug 43P and the Cu wiring 33W can be enlarged. Consequently, as noted above using FIGS. 16 and 17, even in the case where vacant holes concentrate at the plug 43P-Cu wiring 33W interface due to stress migration, it is possible to strengthen the resistance to discontinuity caused by stress migration between the Cu wirings 33W and 43, whereby it is possible to suppress the occurrence of such a discontinuity between the Cu wirings 33W and 43. Although, in FIGS. 18 and 19, W21 is set to be about twice as large as W1, W21 may be designed still larger, e.g., about three times or more (see FIG. 23).

Figure 23:
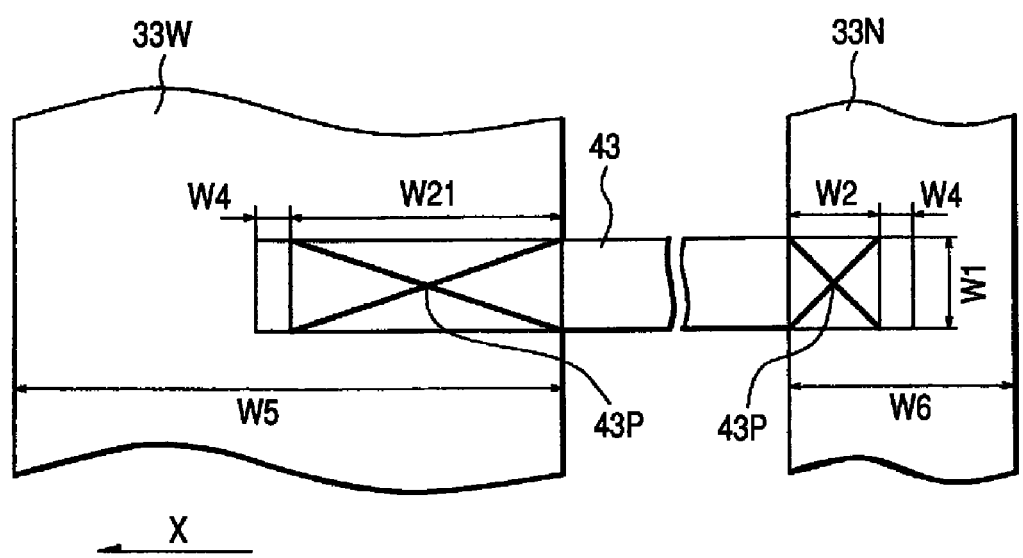
FIG. 23 is a plan view of a principal portion of the semiconductor integrated circuit device according to the first embodiment, as seen during the manufacture thereof.
Figure 24:
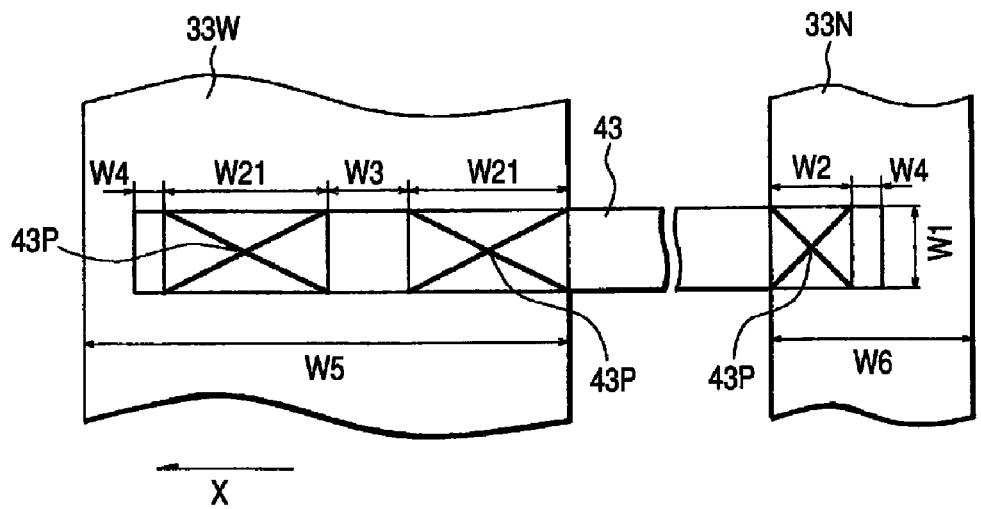
FIG. 24 is a plan view of a principal portion of the semiconductor integrated circuit device according to the first embodiment, as seen during the manufacture thereof.

As shown in FIG. 24, if plural such plugs 43P having the diameter W21 enlarged in the extending direction (X direction) of the Cu wiring 43, as shown in FIGS. 21 to 23, can be arranged in the extending direction of the Cu wiring 43, such an arrangement may be adopted. FIG. 23 shows an example in which two such plugs 43P are arranged. In this case, for example, the distance between the adjacent plugs 43P may be set at about 0.18 μm, as is the case with the example given above in connection with FIGS. 18 and 19. By thus arranging plural plugs 43P in the extending direction (X direction) of the Cu wiring 43, in the plugs 43P, each having the diameter W21 enlarged in the extending direction of the Cu wiring 43, the resistance to discontinuity caused by stress migration between the Cu wirings 33W and 43 can be made stronger than in the arrangement shown in FIGS. 21 to 23.

Figure 25:
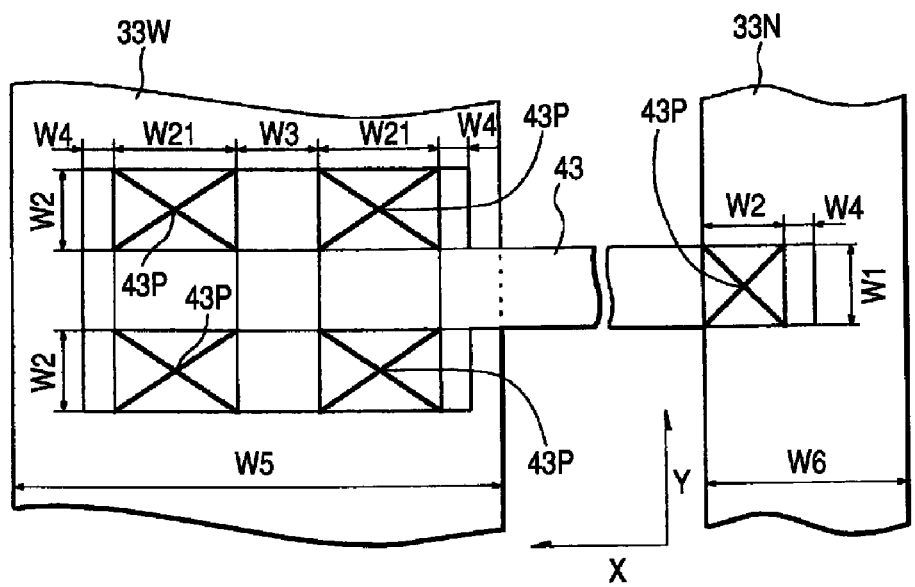
FIG. 25 is a plan view of a principal portion of the semiconductor integrated circuit device according to the first embodiment, as seen during the manufacture thereof.

A construction such as shown in FIG. 25 may be adopted, wherein the width of the Cu wiring 43 is enlarged on the Cu wiring 33W, and plural plugs 43P, each having an enlarged diameter W1 in the extending direction (X direction) of the Cu wiring 43, are arranged in the extending direction of the Cu wiring 43 (see FIG. 23) and also in the extending direction (Y direction) of the Cu wiring 33W. In the case where plural such plugs 43P are arranged in both X and Y directions, their positions are designed manually. In FIG. 25, two plugs 43P are arranged in each of X and Y directions. By using such a means for the arrangement of plugs 43P, the resistance to discontinuity caused by stress migration between the Cu wirings 33W and 43 can be made stronger than in the arrangement shown in FIG. 24.

Figure 26:
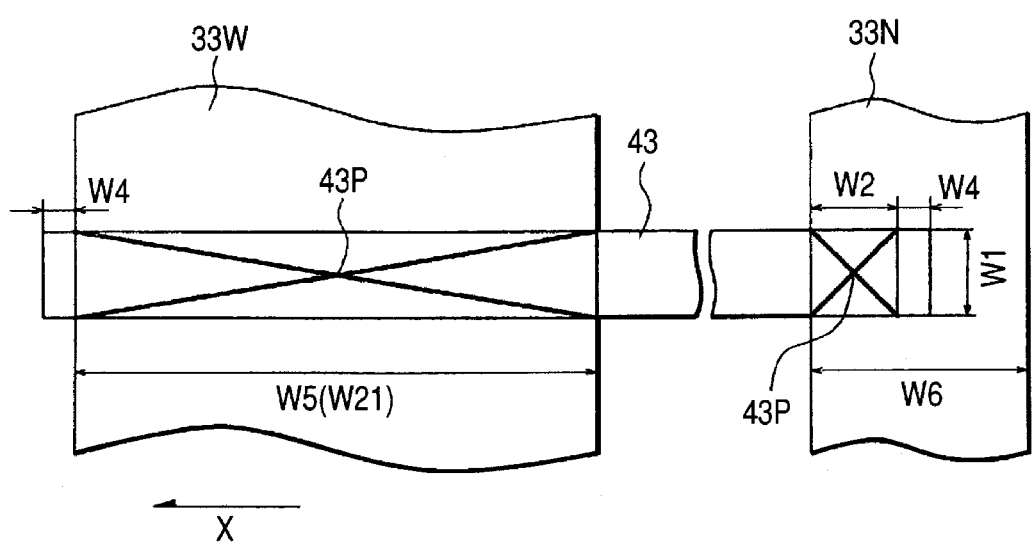
FIG. 26 is a plan view of a principal portion of the semiconductor integrated circuit device according to the first embodiment, as seen during the manufacture thereof.

Further, a construction as shown in FIG. 26 may be adopted wherein patterning is provided so that the Cu wiring 43 spans the Cu wiring 33W, and the diameter W21 of the plug 43P in the extending direction (X direction) of the Cu wiring 43 is enlarged to about the same degree as the width W5 of the Cu wiring 33W. By disposing such a plug 43P, the resistance to discontinuity caused by stress migration between the Cu wirings 33W and 43 can be made stronger than in the arrangement shown in FIGS. 21 to 23.

In this first embodiment, although the number of plugs 43P disposed is only one in the case where the width of the Cu wiring 33W (including Cu wiring 33N) is about 0.9 μm or smaller, there is no limitation on the invention in this regard. If the width of the Cu wiring 33W (including Cu wiring 33N) is not smaller than about 0.6 μm and is smaller than 0.9 μm, two plugs 43P may be arranged on the Cu wiring 33W, as shown in FIGS. 18 and 19, or only one plug 43P may be disposed on the Cu wiring 33W, and its diameter W21 in the extending direction (X direction) of the Cu wiring 43 may be enlarged.

Figure 27:
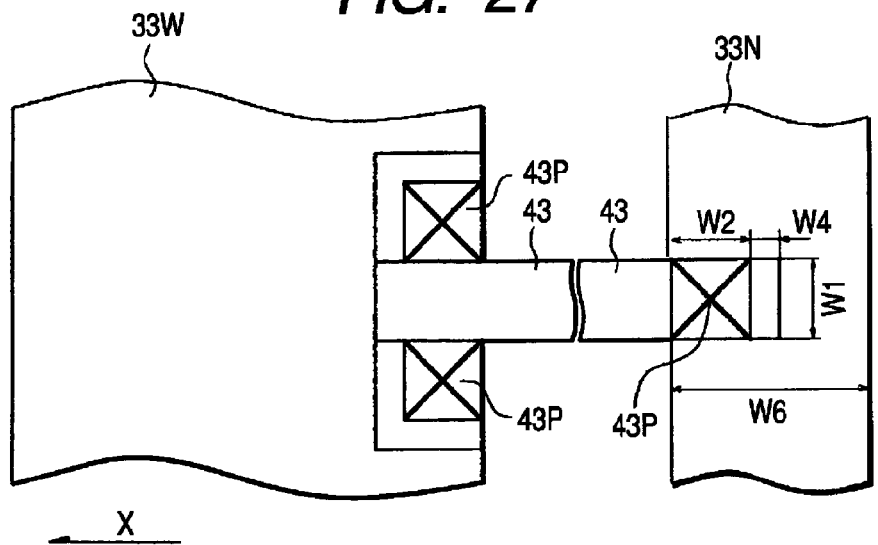
FIG. 27 is a plan view of a principal portion of the semiconductor integrated circuit device according to the first embodiment, as seen during the manufacture thereof.
Figure 28:
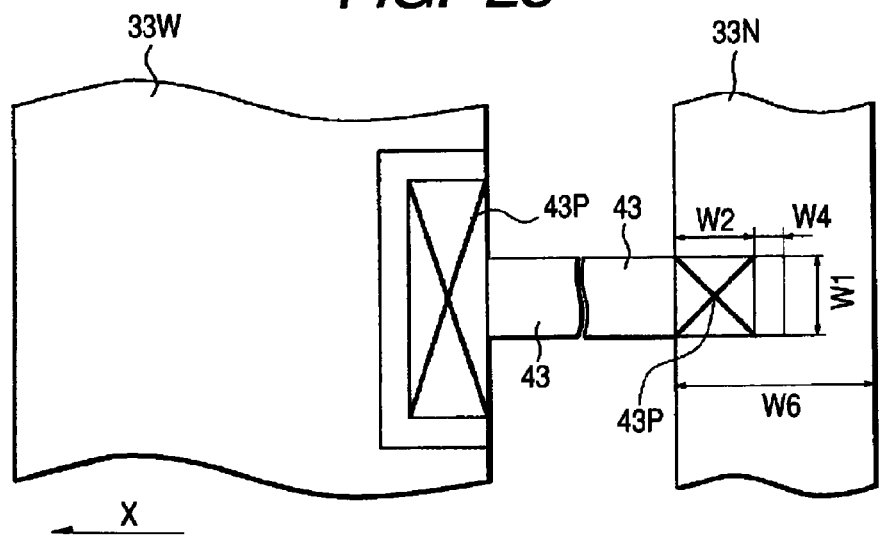
FIG. 28 is a plan view of a principal portion of the semiconductor integrated circuit device according to the first embodiment of the present invention, as seen during the manufacture thereof.

If the width of the Cu wiring 33W (including Cu wiring 33N) is smaller than 0.6 μm, two or more plugs 43P may be arranged on the Cu wiring 33W in the extending direction (perpendicular to the X direction) of the same wiring, as shown in FIG. 27. An arrangement such as shown in FIG. 28 may be adopted wherein one plug 43P is disposed on the Cu wiring 33W, and its diameter W21 in the extending direction (perpendicular to the X direction) of the Cu wiring 33W is enlarged. The Cu wiring 43 extending over the Cu wiring 33W may be further extended in the extending direction of the Cu wiring 33W, and three or more plugs 43P may be arranged, or only one plug 43P may be disposed and its diameter W21 in the extending direction (X direction) of the Cu wiring 43 may be enlarged. In this way, even when the width of the Cu wiring 33W (including Cu wiring 33N) is smaller than 0.5 μm, it is possible to suppress the occurrence of discontinuity caused by stress migration between the Cu wirings 33W and 43.

Figure 29:
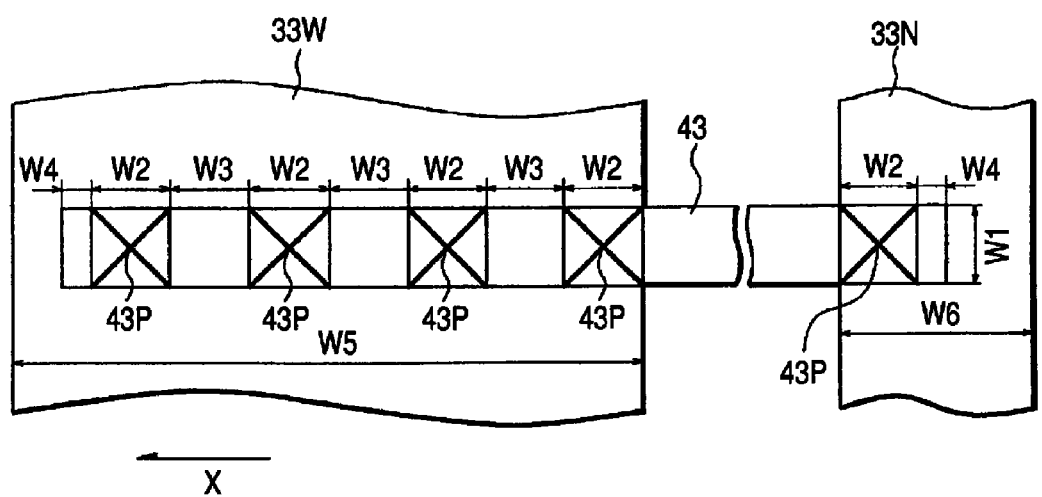
FIG. 29 is a plan view of a principal portion of the semiconductor integrated circuit device according to the first embodiment of the present invention, as seen during the manufacture thereof.
Figure 30:
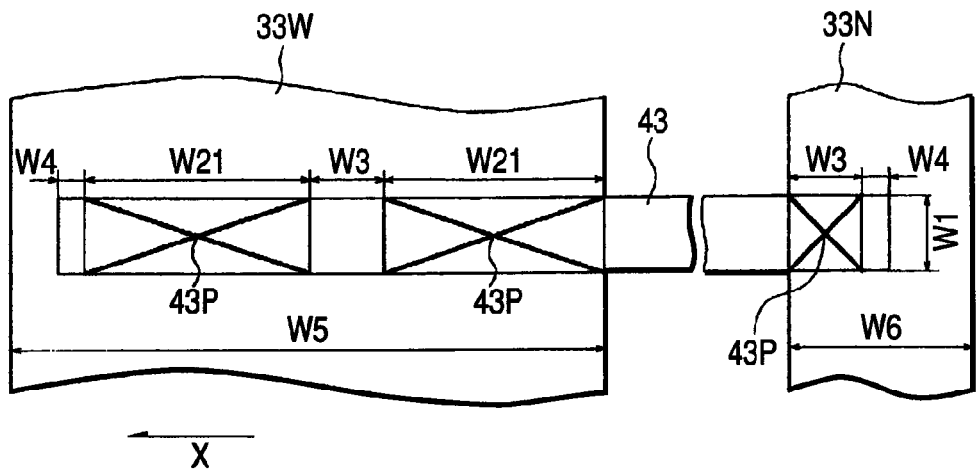
FIG. 30 is a plan view of a principal portion of the semiconductor integrated circuit device according to the first embodiment, as seen during the manufacture thereof.

In the case where the width of the Cu wiring 33W is about 1.44 μm or more, four or more plugs 43P are arranged on the Cu wiring 33W, for example, as shown in FIG. 29. FIG. 29 shows an example in which four plugs 43P are arranged. In this first embodiment, if the width of the Cu wiring 33W is about 1.44 μm or more, even if there are four or more plugs 43P connected to the Cu wiring 33W, there is little influence on the size of the cell which forms the semiconductor integrated circuit device of this first embodiment. Accordingly, it is possible to easily arrange four or more plugs 43P connected to the Cu wiring 33W. Thus, in the case where the width of the underlying Cu wiring 33W becomes large, and if the number of plugs 43P connected to the Cu wiring 33W is increased accordingly, is it possible to obtain the same effect as that described above in connection with FIGS. 18 and 19. As shown in FIG. 30, also in the case where the width of the Cu wiring 33W is about 1.44 µm or more, plural plugs 43P each having an enlarged diameter W21 in the extending direction (X direction) of the Cu wiring 43, as described previously in connection with FIGS. 21 to 23, may be arranged in the extending direction of the Cu wiring 43. In this way, even when the width of the Cu wiring 33W is about 1.44 µm or more, it is possible to obtain the same effect as that described earlier in connection with FIGS. 21 to 23.

Figure 31:
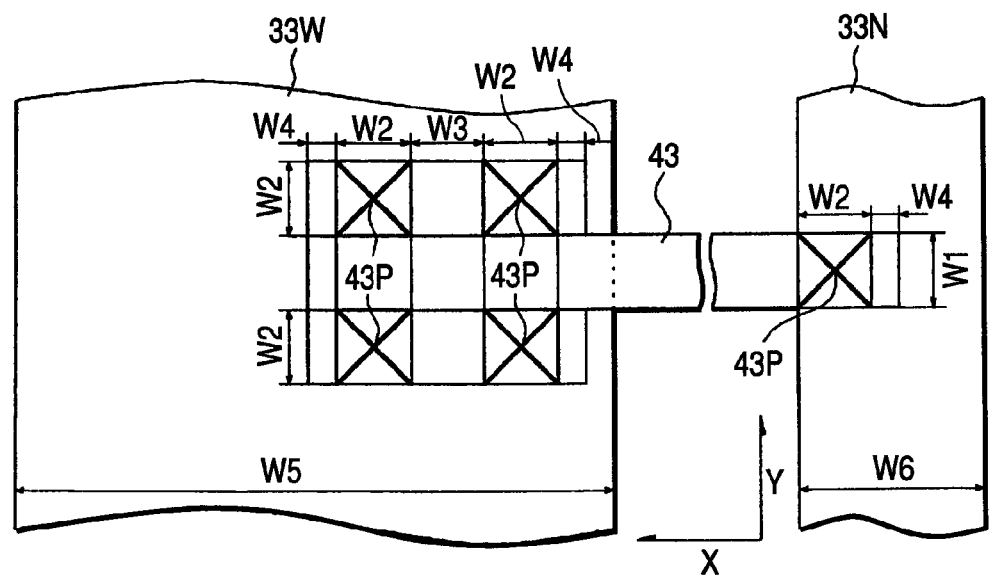
FIG. 31 is a plan view of a principal portion of the semiconductor integrated circuit device according to the first embodiment as seen during the manufacture thereof.
Figure 32:
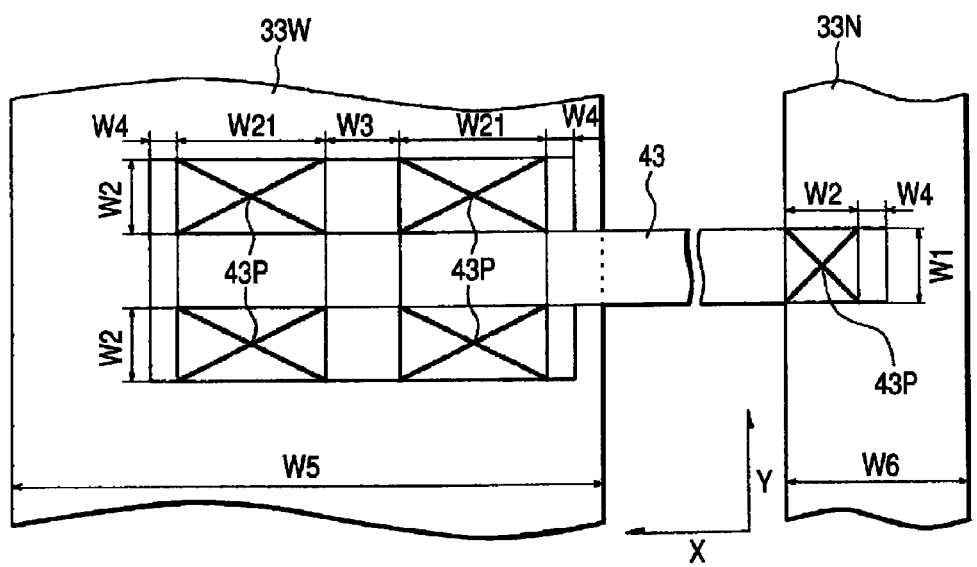
FIG. 32 is a plan view of a principal portion of the semiconductor integrated circuit device according to the first embodiment as seen during the manufacture thereof.

In the case where the width of the Cu wiring 33W is about 1.44 µm or more, it is possible to adopt means other than the means wherein four or more plugs 43P are arranged in a row on the Cu wiring 33W in the extending direction (X direction) of the Cu wiring 43. For example, it is possible to adopt means as shown in FIG. 31, wherein the width of the Cu wiring 43 is made larger on the Cu wiring 33W, and plural plugs 43P are arranged in each of the extending direction of the Cu wiring 43 and the extending direction (X direction) of the Cu wiring 33W. In the example shown in FIG. 31, two plugs 43P are arranged in each of both X and Y directions. As an example, it is assumed that the distance W3 between adjacent plugs 43P in the X direction is almost equal to the diameter of each plug 43P, and the distance between adjacent plugs 43P in the Y direction is almost equal to the width of the Cu wiring 43 on the Cu wiring 33N. Also, by such an arrangement of plugs 43P, it is possible obtain the same effect as that explained above in connection with FIG. 29. Moreover, when the width of the Cu wiring 33W is about 1.44 µm or more, it is possible to use the same means for arranging plugs 43P as that explained above in connection with FIG. 25 (see FIG. 32). With such means, the resistance to discontinuity caused by stress migration between the Cu wirings 33W and 43 can be made stronger than in the case of FIG. 30.

Figure 33:
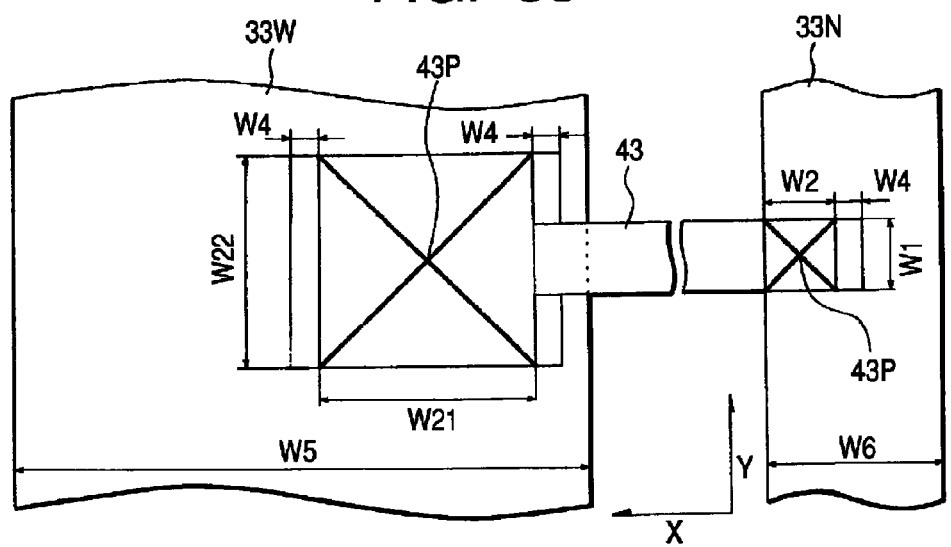
FIG. 33 is a plan view of a principal portion of the semiconductor integrated circuit device according to the first embodiment as seen during the manufacture thereof.

Further, in the case where the width of the Cu wiring 33W is about 1.44 µm or more, it is possible to adopt means as shown in FIG. 33, wherein the Cu wiring 43 is widened on the Cu wiring 33W, and a plug 43P having an enlarged diameter W21 in the extending direction (X direction) of the Cu wiring 43 and an enlarged diameter W22 in the extending direction (Y direction) of the Cu wiring 33W is disposed on the Cu wiring 33W. In this case, for example, W21 and W22 may each be set to be about twice or more as large as the diameter W2 of the plug 43P disposed on the Cu wiring 33N. Also, by thus disposing the plug 43P, it is possible to obtain the same effect as that described above in connection with FIGS. 29 to 32.

According to an experiment conducted by the present inventors, it was found that the methods of arranging the plug(s) 43P providing connection between the Cu wirings 33W and 43 in this first embodiment were particularly effective when the bottom diameter of the plug was about 0.2 µm or less.

In case of actually forming such a large diameter in connection holes having shapes such as shown in FIGS. 21, 23, 24, 25, 26, 30, 32, and 33 in this first embodiment, there is a fear that the selectivity may become small between a layer to be etched (the interlayer insulating film 36) and a layer serving as an etching stopper (the silicon carbonitride film 35). More particularly, in the case where connection holes having diameters W5 and W2, such as shown in FIG. 26, are to be formed simultaneously, the connection hole of W5 is opened before the connection hole of W2 opens, and if etching is then continued until opening of the connection hole of W2, overetching will result, giving rise to the problem that even the portion which underlies the connection hole of W5 and the vicinity thereof are also etched. This etching selectivity also depends on the material of the layer 36 to be etched and of the etching stopper layer 35 and conditions for dry etching, so it generally cannot be defined in terms of the size of diameter alone, but it is necessary that the selectivity in question be at least 5. If the connection hole diameter is made large in this selectivity satisfying range, it will serve as means that is effective for enhancing the resistance to discontinuity caused by stress migration. This is as noted earlier.

The above steps are repeated after the manufacturing steps described previously in connection with FIGS. 7 and 8 to form a single or plural layers of Cu wirings on the third-layer of Cu wiring 43, thereby fabricating the semiconductor integrated circuit device of this first embodiment.

In a Cu wiring layer which overlies the third-layer of Cu wiring, if the diameter of a plug providing connection between those wiring layers is 0.5 µm or more, the plug providing connection between those wiring layers is constituted by one plug, except in the case where plural plugs are needed for some reason, for example, when plural plugs should be provided in an allowable range of current density, although this is no limitation on the invention.

Though the invention is not specially limited, as will be described later, for example, in the second- and third-layer Cu wirings, signal wiring lines for the attainment of a high integration level are formed to have a wiring width of about 0.18 µm, and as a thick wiring having a width of larger than about 0.18 µm, there is a power wiring for the supply of a reference voltage (Vss) or a supply voltage (Vdd).

Second Embodiment

Figure 34:
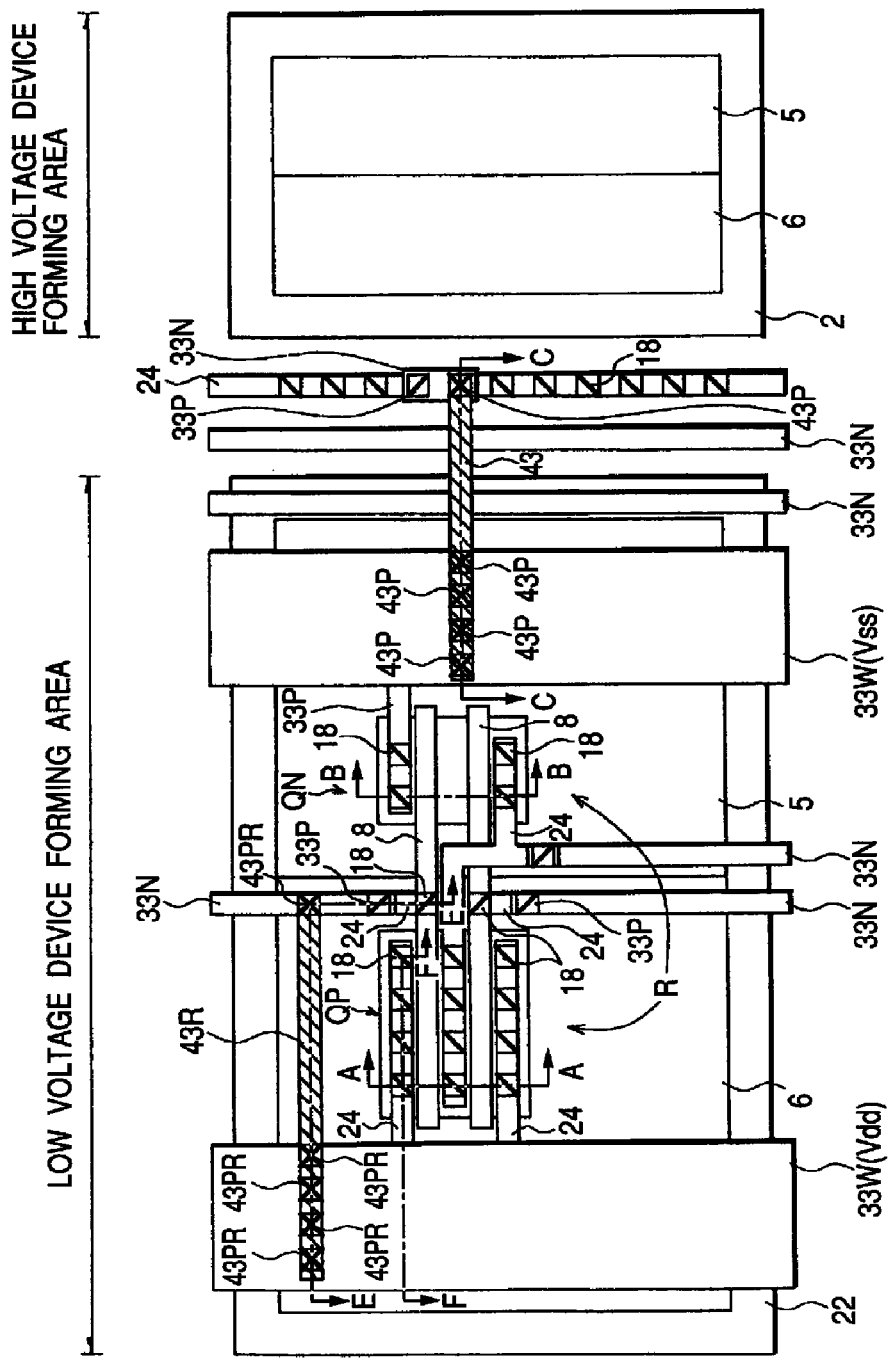
FIG. 34 is a plan view of a principal portion of a semiconductor integrated circuit device according to a second embodiment of the present invention as seen during the manufacture thereof.
Figure 35:
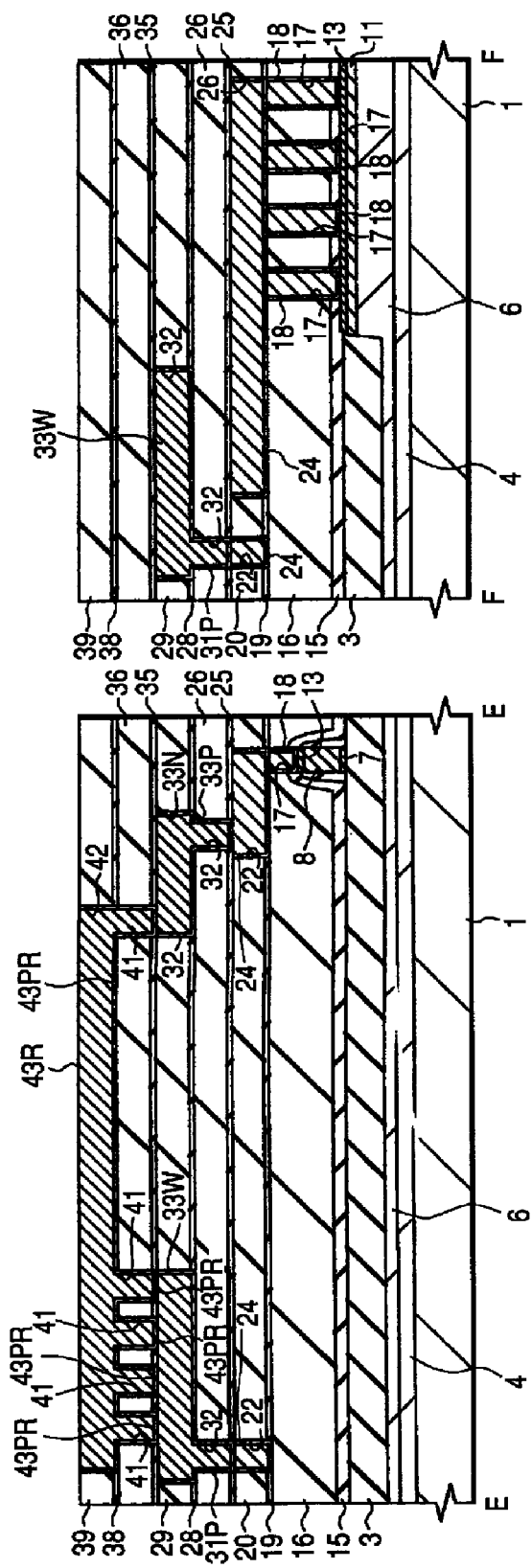
FIG. 35 show sectional views taken along lines E-E and F-F in FIG. 34.

FIG. 34 is a plan view of a principal portion of a semiconductor integrated circuit device according to a second embodiment of the present invention, and FIG. 35 comprises sectional views taken along lines E-E and F-F in FIG. 34.

Figure 36:
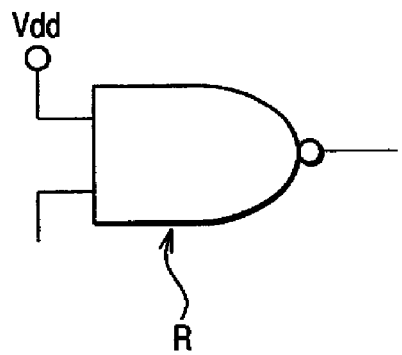
FIG. 36 is an equivalent circuit diagram of a correction circuit of the semiconductor integrated circuit according to the second embodiment.

The process for the manufacture of the semiconductor integrated circuit device of this second embodiment is about the same as that employed in the first embodiment, except that a circuit R for correction is additionally provided. In this second embodiment, as shown in FIGS. 34 and 35, a plug (first plug) 43PR and Cu wiring (second buried wiring) 43R are also formed in the step of forming the plug 43P and Cu wiring 43. In this second embodiment, a circuit R for correction, is formed, beforehand in the semiconductor integrated circuit device. The circuit R is used to correct a circuit connection for example in the event a defect in circuit design should occur in a series of manufacturing steps involving fabrication of the semiconductor integrated circuit device of this second embodiment and a test of circuit operation. More specifically, as to the third-layer Cu wiring 43R, a redundant design is provided beforehand so that a circuit (wiring) found defective is electrically disconnected from the semiconductor integrated circuit device by altering a mask pattern after the end of a circuit operation test and by cutting or connecting wiring lines, or an electric connection for the correction circuit R can be made for correcting a circuit connection. Taking such cutting/connecting process into account, it is preferable that the Cu wiring 43R be formed as a layer that is as high as possible, and in this embodiment the Cu wiring 43R is used, which is the third-layer buried wiring. For example, as shown in FIGS. 34 and 36, for the purpose of avoiding a floating state when the correction circuit R is not in use, an input (gate electrodes of MISFETQn, Qp) of the correction circuit R is electrically connected to Cu wiring 33W (power wiring (Vdd)) through Cu wiring 43R, and thus the potential is fixed.

The Cu wiring 43R is electrically connected to the Cu wiring 33W through plugs 43PR. In this second embodiment, the Cu wiring 33W constitutes a power wiring for the supply of a reference potential (Vss) or a supply potential (Vdd) to MISFETQp, Qn, or p-type well 5 and n-type well 6. Therefore, the potential of the Cu wiring 43R connected electrically to the Cu wiring 33W is fixed. As a result, for example, at the time of start-up of the semiconductor integrated circuit device of this second embodiment, it is possible to prevent a large current flow to the Cu wiring 43R, thus permitting the Cu wiring 43R to be formed at a width which is as fine as possible. More specifically, the width of the Cu wiring 43R becomes relatively narrow in comparison with the width of Cu wiring 33W; therefore, as to the method for arranging the plugs 43PR connecting the Cu wirings 33W and 43R in this second embodiment, the same definition as employed in the method for arranging the plugs 43P connecting the Cu wirings 33W and 43 which has been described in connection with the first embodiment with reference to FIGS. 18 to 33, is employed here. Consequently, also in this second embodiment, as in the first embodiment, it is possible to suppress the occurrence of discontinuity (breaking of wire) caused by stress migration between the Cu wirings 33W and 43R.

Third Embodiment

Figure 37:
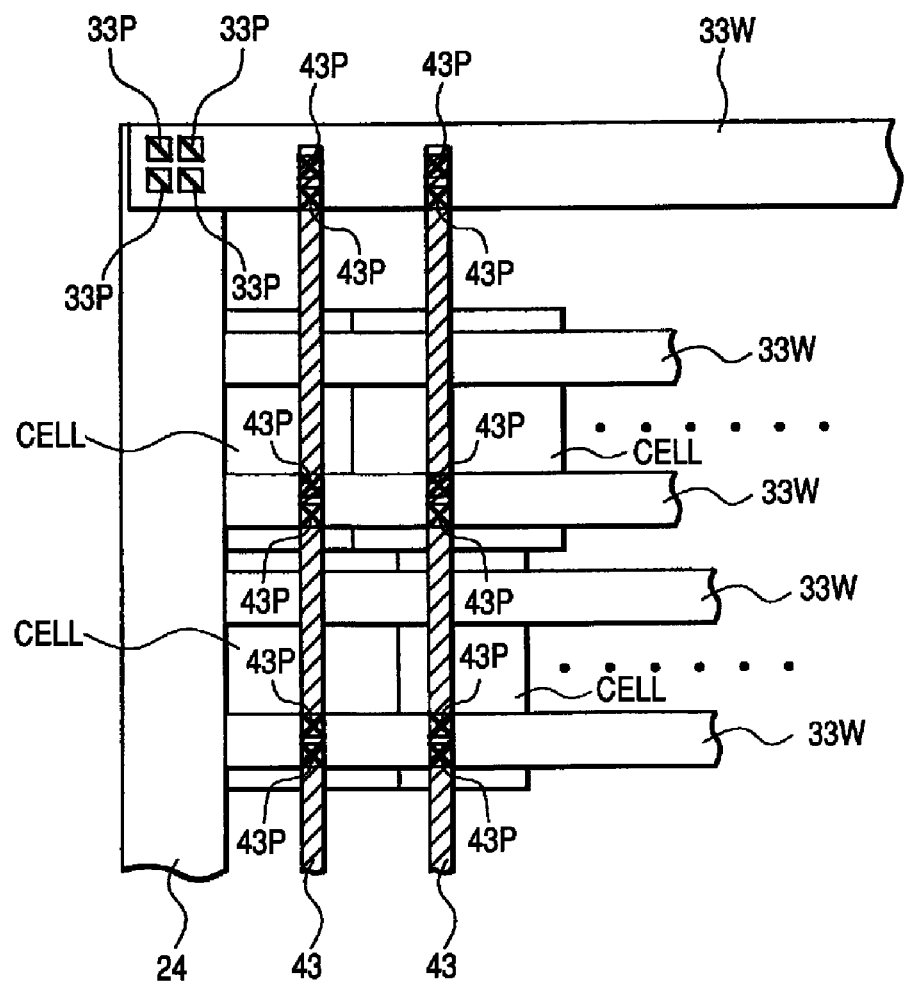
FIG. 37 is a plan view of a principal portion of a semiconductor integrated circuit device according to a third embodiment of the present invention as seen during the manufacture thereof.

FIG. 37 is a plan view of a principal portion of a semiconductor integrated circuit device according to a third embodiment of the present invention.

The process for the manufacture of the semiconductor integrated circuit device of this third embodiment is about the same as the process used for the manufacture of the semiconductor integrated circuit devices of the first and second embodiments. In this third embodiment, in order to prevent the occurrence of a potential difference between plural Cu wirings 33W, that are used as main power lines arranged on the arrangement of cells which form the semiconductor integrated circuit device of this third embodiment and which are connected electrically to a reference (earth) potential, the plural Cu wirings 33W are connected electrically using Cu wirings 43 which overlie the Cu wirings 33W. That is, the Cu wirings 43 are used as auxiliary power lines for the plural Cu wirings 33W.

Thus, the Cu wirings 43 as used in this third embodiment are auxiliary power lines. Further, for the purpose of reducing the area of a semiconductor chip, with the semiconductor integrated circuit device of this third embodiment formed thereon, the density of the wiring arrangement, including the Cu wirings 43, should be increased. Accordingly, the Cu wirings 43 being used as auxiliary power lines are formed so as to have a width that is as small as possible. More specifically, the width of each Cu wiring 43 becomes relatively narrow in comparison with the width of each Cu wiring 33W; therefore, as to the method of arranging the plugs 43P which connect the Cu wirings 33W and 43 in this third embodiment, the same definition as employed in the method for arranging the plug(s) connecting the Cu wirings 33W and 43, which has been described previously in connection with FIGS. 18 to 33, is employed here. As a result, also in this third embodiment, it is possible to suppress the occurrence of discontinuity (breaking of wire) caused by stress migration between the Cu wirings 33W and 43.

Also, in this third embodiment, which is constructed as above-described, it is possible to obtain the same effect as in the previous first and third embodiments.

Fourth Embodiment

Figure 38:
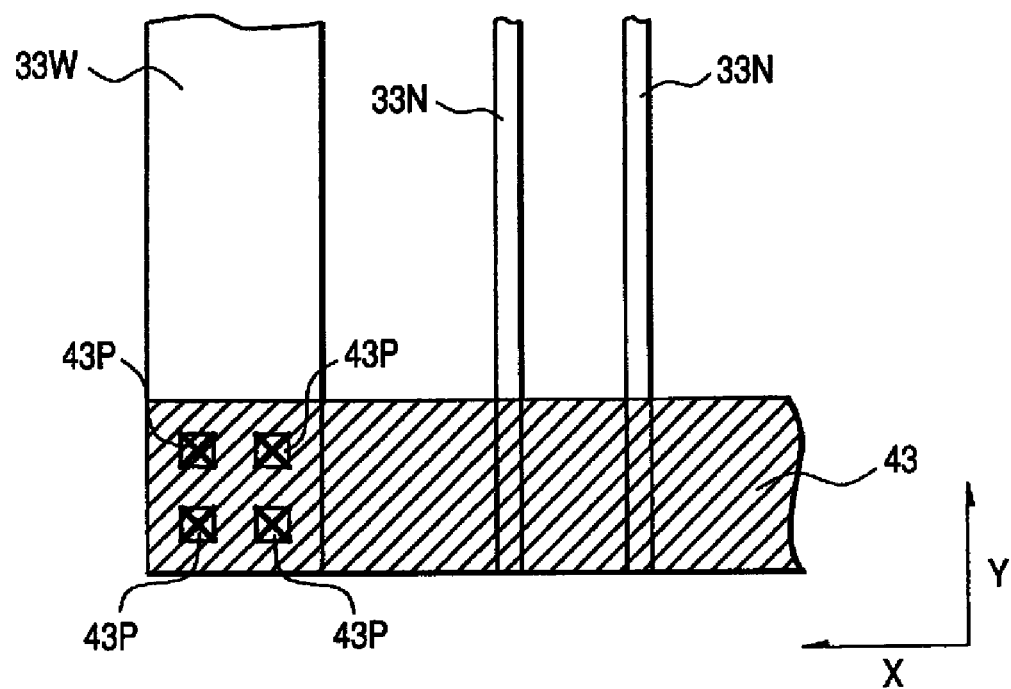
FIG. 38 is a plan view of a principal portion of a semiconductor integrated circuit device according to a fourth embodiment of the present invention as seen during the manufacture thereof.

FIG. 38 is a plan view of a principal portion of a semiconductor integrated circuit device according to a fourth embodiment of the present invention.

The process for the manufacture of the semiconductor integrated circuit device of this fourth embodiment is about the same as the process used for the manufacture of the semiconductor integrated circuit devices of the first to third embodiments. In this fourth embodiment, for the purpose of allowing an electric current that is relatively large in comparison with that in the first embodiment to flow through Cu wiring 43, the Cu wiring 43 is formed to have a relatively large width as compared with that of Cu wiring 43 (see FIGS. 8 and 9), which has been described in conjunction with the first embodiment. In this fourth embodiment, the width of each of Cu wirings 33W and 43 is set at about 3 μm. In this case, plugs 43P, which connect the Cu wirings 33W and 43 electrically with each other, are arranged in an arrangeable number at as narrow intervals as possible in an overlapping area of the wirings. For example, two plugs 43P, each having a diameter of about 0.6 μm, are arranged in the extending direction (X direction) of the Cu wiring 43, and two such plugs are also arranged in the extending direction (Y direction) of the Cu wiring 33W. In the case where only one plug 43P having a relatively small diameter with respect to the width of the Cu wirings 33W and 43 is disposed between the Cu wirings 33W and 43, there is a fear that a discontinuity (breaking of wire) may occur caused by stress migration between the Cu wirings 33W and 43. But the occurrence of such an inconvenience can be avoided by using the above means for arranging plugs 43P in this fourth embodiment.

Figure 39:
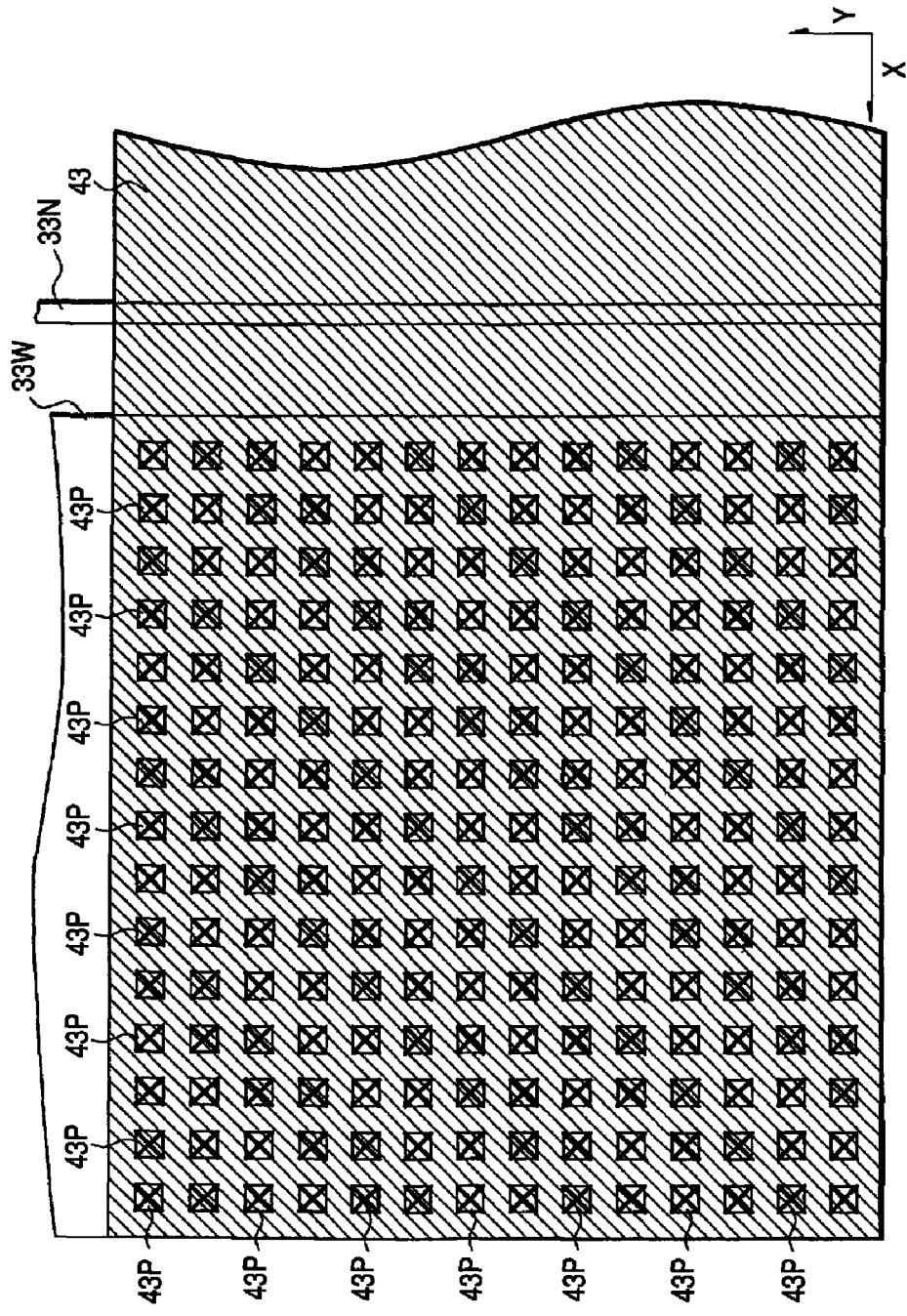
FIG. 39 is a plan view of a principal portion of the semiconductor integrated circuit device according to the fourth embodiment as seen during the manufacture thereof.

In the case where the Cu wiring 33W is used as a main power line, as shown in FIG. 39, the Cu wirings 33W and 43 are formed so as to have a still larger width than shown in FIG. 38. For example, the width of each of the Cu wirings 33W and 43 is set at about 17 μm. In this case, a larger number of plugs 43P than shown in FIG. 38 are employed. For example, fifteen plugs 43P, each having a diameter of about 0.6 μm, are arranged in the extending direction (X direction) of the Cu wiring 43, and the same number of such plugs are also arranged in the extending direction (Y direction) of the Cu wiring 33W. Thus, even in the case of wider Cu wirings 33W and 43, the occurrence of a discontinuity (breaking of wire) caused by stress migration between the Cu wirings 33W and 43 can be suppressed by accordingly increasing the number of plugs 43P which connect the Cu wirings 33W and 43 electrically with each other.

Also, in this fourth embodiment, as described above, it is possible to obtain the same effect as in the previous first to third embodiments.

Fifth Embodiment

FIG. 40 is a plan view of a principal portion of a semiconductor integrated circuit device according to a fifth embodiment of the present invention.

A process for manufacture of the semiconductor integrated circuit device according to this fifth embodiment is almost the same as the process used for the manufacture of the semiconductor integrated circuit devices of the previous first to fourth embodiments. In this fifth embodiment, a layout design of wirings and plugs is performed automatically by means of a computer. For example, as seen in FIG. 40, plural wiring lattice lines (first wiring lattice lines) LL1 extend in the Y direction and are arranged at intervals of PX, plural wiring lattice lines (second wiring lattice lines) LL2 extend in the X direction and are arranged at intervals of PY, Cu wirings 33W and 33N are designed so that their centers in their width direction are each positioned on a wiring lattice line LL1, and Cu wiring 43 is designed so that the center thereof in its width direction is positioned on a wiring lattice line LL2. In this case, if the position where each plug 43P is to be disposed is set automatically using a computer, the center of the plug 43P is positioned at a point of intersection between wiring lattice lines LL1 and LL2. In this fifth embodiment, however, the position where each plug 43P is to be disposed on Cu wiring 33W, which has a relatively large width in comparison with Cu wiring 33N, is not set automatically using a computer, but is set manually. That is, the position where the plug 43P is to be disposed is set so that the center of the plug is not located on a wiring lattice line LL1. In this case, the center of the plug 43P and the associated lattice wiring line LL1 are spaced apart at least by a minimum required distance (e.g., at least about a half of the diameter of the plug 43P), which serves as an alignment margin for the plug 43P, and the position where the plug 43P is disposed is approximated to an end in the width direction of the Cu wiring 33W, as seen in plan view. Further, the plug 43P is disposed so as to be connected to the Cu wiring 33W without disalignment at a position as close as possible to an end in the width direction of the Cu wiring 33W. Many vacant holes, which are a cause of discontinuity due to stress migration, are present within the film of the Cu wiring 33W, and they gather from all directions, being centered at the plug 43P-Cu wiring 33W interface. But according to the above-described position set for the plug 43P, it is possible to prevent a concentration of vacant holes from a transverse end of the Cu wiring 33W, whereby it is possible to suppress the occurrence of discontinuity caused by stress migration between the Cu wirings 33W and 43.

Also in this fifth embodiment, it is possible to obtain the same effect as was obtained in the first to fourth embodiments.

Although the present invention has been described above specifically by way of various embodiments thereof, it goes without saying that the invention is not limited to the above-described embodiments and that various changes may be made within a scope not departing from the gist of the invention.

One of the first to fifth embodiments may be combined with one or more of the others.

Although in the above-described embodiments the present invention is applied to a manufacturing process for buried wirings (Cu wirings) and a plug(s) providing connection between the buried wirings in a CMOS-LSI, the invention may also be applied to a manufacturing process for the fabrication of buried wirings and a buried wiring connecting plug(s) in a SRAM (Static Random Access Memory), rather than a CMOS-LSI.

The following is a brief description of effects obtained in the foregoing embodiments.

(1) In forming plural layers of buried wirings by burying a conductive film containing Cu as a main component into wiring grooves formed by etching an insulating film, by arranging plural plugs (first plugs), which provide an electrical connection between a lower-layer buried wiring (first buried wiring) and an upper-layer buried wiring (second buried wiring), it is possible to prevent vacant holes from being concentrated due to stress migration at an interface between one plug and the lower-layer buried wiring, and, hence it is possible to prevent the occurrence of discontinuity between the lower- and upper-layer buried wirings.

(2) In forming plural layers of buried wirings by burying a conductive film containing Cu as a main component into wiring grooves formed by etching an insulating film, by enlarging the diameter of a plug (first plug), which provides an electrical connection between a lower-layer buried wiring (first buried wiring) and an upper-layer buried wiring (second buried wiring), to increase the area of contact between the plug and the lower-layer wiring, it is possible to prevent the occurrence of a discontinuity between the lower- and upper-layer buried wirings even when vacant holes are concentrated due to stress migration at an interface between the plug and the lower-layer buried wiring.

(3) In forming plural layers of buried wirings by burying a conductive film containing Cu as a main component into wiring grooves formed by etching an insulating film, by connecting a plug (first plug) to a lower-layer buried wiring at a position close to an end of the lower-layer buried wiring, the plug providing an electrical connection between the lower-layer buried wiring (first buried wiring) and an upper-layer buried wiring (second buried wiring), it is possible to decrease the quantity of vacant holes which are concentrated at an interface between the plug and the lower-layer buried wiring due to stress migration, and, hence, it is possible to prevent the occurrence of a discontinuity between the lower- and upper-layer buried wirings.

The following is a brief description of an effect obtained by a typical mode of the present invention as disclosed herein.

It is possible to prevent the occurrence of a discontinuity caused by stress migration at an interface between a plug connected at a bottom thereof to a buried wiring and the buried wiring.

What is claimed is:
1. A semiconductor integrated circuit device comprising:
a first insulating film formed over a semiconductor substrate;
first and third grooves formed in the first insulating film and extending to a first direction;
first and third wirings comprised of a first conductive film and buried in the first and third grooves, respectively,
a width, in a second direction perpendicular to the first direction, of the first wiring being greater than a width, in the second direction, of the third wiring;
a second insulating film formed over the first insulating film, the first wiring and the third wiring;
a second groove formed in the second insulating film and extending to the second direction;
first and second holes formed in the second insulating film such that the first hole is connected with the first wiring and the second groove and such that the second hole is connected with the third wiring and the second groove; and
a second wiring, a first plug and a second plug comprised of a second conductive film and buried in the second groove, the first holes and the second hole, respectively,
a width, in the second direction, of the first wiring being greater than a width, in the first direction, of the second wiring such that the second wiring has a width, in the first direction, which prevents the forming of two first plugs adjacent to each other in the first direction,
wherein the first conductive film and the second conductive film are comprised of copper as a main component, respectively,
wherein, in the second direction, the first wiring has a first end near the third wiring, and a second end distant from the third wiring,
wherein, in the second direction, the first plug is arranged so that the distance from the center of the first plug to the first end of the first wiring differs from the distance from the center of the first plug to the second end of the first wiring, wherein, in the second direction, the third wiring has a first end near the first wiring, and a second end distant from the first wiring, wherein, in the second direction, the second plug is arranged so that the distance from the center of the second plug to the first end of the third wiring differs from the distance from the center of the second plug to the second end of the third wiring, wherein, in the second direction, the first plug is arranged near the first end of the first wiring, and wherein, in the second direction, the second plug is arranged near the first end of the third wiring.

2. A semiconductor integrated circuit device according to claim 1, wherein each of the first conductive film and the second conductive film includes a barrier metal film.

3. A semiconductor integrated circuit device according to claim 2, wherein the barrier metal film is formed of a TiN film, a WN film, a TaN film, a TiSiN film or a Ta film.

4. A semiconductor integrated circuit device according to claim 1, wherein the end of the first plug is located at the same position as the first end of the first wiring.

5. A semiconductor integrated circuit device according to claim 1, wherein the first plug has a diameter equal to the width of the second wiring.

6. A semiconductor integrated circuit device according to claim 1, wherein the first plug has a diameter larger than that of the second plug, as measured in the second direction.

7. A semiconductor integrated circuit device according to claim 1, wherein the first wiring is a power supply wiring.

8. A semiconductor integrated circuit device according to claim 1, wherein the dielectric constants of the first and second insulating films are smaller than that of a silicon oxide film.

* * * * *